(12) United States Patent
Kim et al.

(10) Patent No.: US 12,543,406 B2
(45) Date of Patent: Feb. 3, 2026

(54) RGB MONOLITHIC INTEGRATED HIGH PURITY MICROLED DISPLAY DEVICE

(71) Applicant: Plessey Semiconductors Ltd, Plymouth Devon (GB)

(72) Inventors: Jun-Youn Kim, Plymouth Devon (GB); Anwer Saeed, Plymouth Devon (GB); Andrea Pinos, Plymouth Devon (GB); Mohsin Aziz, Plymouth Devon (GB); Ian Murray, Plymouth Devon (GB); Abdul Shakoor, Plymouth Devon (GB)

(73) Assignee: Plessey Semiconductors Ltd, Plymouth Devon (GB)

( * ) Notice: Subject to any disclaimer, the term of this patent is extended or adjusted under 35 U.S.C. 154(b) by 394 days.

(21) Appl. No.: 18/030,054

(22) PCT Filed: Oct. 22, 2021

(86) PCT No.: PCT/GB2021/052747
§ 371 (c)(1),
(2) Date: Apr. 3, 2023

(87) PCT Pub. No.: WO2022/090693
PCT Pub. Date: May 5, 2022

(65) Prior Publication Data
US 2024/0038927 A1    Feb. 1, 2024

(30) Foreign Application Priority Data
Oct. 28, 2020   (GB) ...................................... 2017075

(51) Int. Cl.
*H10H 20/814*   (2025.01)
*H10H 20/01*   (2025.01)
(Continued)

(52) U.S. Cl.
CPC .. *H10H 20/8142* (2025.01); *H10H 20/01335* (2025.01); *H10H 20/812* (2025.01); *H10H 29/142* (2025.01)

(58) Field of Classification Search
CPC .......................... H10H 20/8142; H10H 20/862
See application file for complete search history.

(56) References Cited

U.S. PATENT DOCUMENTS

2007/0046190 A1*  3/2007  Lo .................... H10K 50/856
                                                          313/506
2013/0147689 A1   6/2013  Liu et al.
(Continued)

FOREIGN PATENT DOCUMENTS

| CN | 110112172 B | 6/2021 |
| EP | 3699967 A1 | 8/2020 |

(Continued)

OTHER PUBLICATIONS

International Search Report and Written Opinion in PCT International Application No. PCT/GB2021/052747 mailed Feb. 3, 2022.
(Continued)

*Primary Examiner* — Ajay Ojha
*Assistant Examiner* — Hajar Kolahdouzan
(74) *Attorney, Agent, or Firm* — Cognition IP, P.C.; Edward Steakley

(57) ABSTRACT

A colour conversion resonator system, comprising: a first partially reflective region configured to transmit light of a first primary peak wavelength and to reflect light of a second primary peak wavelength; a second partially reflective region configured to at least partially transmit light of the first and second primary peak wavelengths and to reflect light of a third primary peak wavelength; a third partially reflective region configured to at least partially reflect light with the third primary peak wavelength; a first colour conversion resonator cavity arranged to receive input light with the first primary peak wavelength through the first partially reflective region and to convert at least some of the light of the first primary peak wavelength to provide light of the second primary peak wavelength, wherein the first colour conversion resonator cavity is arranged such that the second primary peak wavelength resonates in the first colour conversion resonator cavity and resonant light with the second primary peak wavelength is output through the second partially reflective region; and a second colour conversion resonator cavity arranged to receive input light comprising the second primary peak wavelength through the second partially reflective region and to convert at least some of the second primary peak wavelength to provide light of the third primary peak wavelength, wherein the second colour conversion resonator cavity is arranged such (Continued)

that the third primary peak wavelength resonates in the second colour conversion resonator cavity and resonant light with the third primary peak wavelength is output through the third partially reflective region, wherein the first colour conversion resonator cavity and the second resonator cavity are arranged partially to overlap to provide a non-overlapping portion and an overlapping portion thereby to define a first light emitting surface and a second light emitting surface respectively, wherein the first light emitting surface is arranged to provide resonant light of the second primary peak wavelength and the second light emitting surface is arranged to provide resonant light of the third primary peak wavelength.

20 Claims, 11 Drawing Sheets

(51) Int. Cl.
  *H10H 20/812* (2025.01)
  *H10H 29/14* (2025.01)

(56) References Cited

U.S. PATENT DOCUMENTS

| | | |
|---|---|---|
| 2014/0055845 A1 | 2/2014 | Jain |
| 2016/0293803 A1 | 10/2016 | Kim et al. |
| 2019/0372060 A1* | 12/2019 | Li .................. H10K 50/131 |
| 2020/0075816 A1 | 3/2020 | Cheng et al. |
| 2020/0274036 A1 | 8/2020 | Le Blevennec et al. |

FOREIGN PATENT DOCUMENTS

| | | |
|---|---|---|
| JP | 2017037121 A | 2/2017 |
| KR | 20090004403 A | 1/2009 |
| WO | 2011129538 A2 | 10/2011 |
| WO | 2020104495 A1 | 5/2020 |

OTHER PUBLICATIONS

1st Examination Report (TW) mailed on Jan. 9, 2023.
Examination Report and Notification of Intention to Grant under Section 18(4) mailed on Aug. 11, 2022.
Patents Act 1977: Search Report under Section 17, mailed on Apr. 15, 2021.
G.-S. Chen, B.-Y. Wei, C.-T. Lee and H.-Y. Lee, "Monolithic Red/Green/Blue Micro-LEDs With HBR and DBR Structures," in IEEE Photonics Technology Letters, vol. 30, No. 3, pp. 262-265, 1 Feb. 1, 2018, doi: 10.1109/LPT.2017.2786737.
International Preliminary Report on Patentability in PCT application No. PCT/GB2021/052747, mailed May 11, 2023.
Notice of Refusal received in counterpart Japanese application No. 2023-526058, mailed on Oct. 7, 2025.

* cited by examiner

RGB MONOLITHIC INTEGRATED HIGH PURITY MICROLED DISPLAY DEVICE

CROSS-REFERENCE TO RELATED APPLICATIONS

This application is a 35 U.S.C. § 371 U.S. National Stage application of International Application No. PCT/GB2021/052747, filed on Oct. 22, 2021, which claims the benefit of priority of Great Britain Application No. 2017075.9, filed on Oct. 28, 2020, which are incorporated herein by reference in their entirety.

FIELD OF THE INVENTION

The invention relates to light emitting diode structures and methods of forming light emitting diode structures. In particular, but not exclusively, the invention relates to a vertically integrated colour conversion resonator system.

BACKGROUND OF THE INVENTION

It is known to generate wavelengths of a desired primary peak wavelength using a pump source light emitting diode (LED) to provide input light and colour conversion materials to convert such input light to light of a desired wavelength. Such colour conversion materials can be phosphor materials or quantum dots (QDs), for example. Of particular importance is to generate light with wavelengths corresponding to red, green and blue light. Such colour light emission has significance in display applications.

It is known to provide red, green and blue light from a single wafer of monolithically grown light emitting diode devices that produce light of a particular wavelength (typically blue light), using QD materials to down convert the light. Similarly, red, green and blue light emitting structures comprising quantum wells (QWs) can be stacked on top of one another to produce a stacked device. In such devices, at low current level, the top most QW lights up and by increasing the current level, the middle and bottom QWs are lit up sequentially.

However, QD materials are not ready for microLED display applications as such materials typically easily degrade over 0.2 W/cm$^2$ input power. Further, where QDs are used as the colour conversion material, the thickness of the layers of QD material are typically at least 20 µm in order to fully absorb input light. Accordingly, the thickness of QD material needed to provide sufficient conversion of light wavelength is greater than that suitable to provide the pixel size and pitch needed in high resolution microLED arrays. Furthermore, typical colour conversion materials, such as QDs and phosphor materials, result in a large full width half maximum (FWHM) spectrum and hence a reduced colour gamut.

Accordingly, there is a need for sources of distinct and different wavelengths of light, such as red, green and blue light, with an increased colour gamut suitable for microLEDs.

SUMMARY OF THE INVENTION

In order to mitigate for at least some of the above-described problems, there is provided a colour conversion resonator system and a method of forming a colour conversion resonator system in accordance with the appended claims.

There is provided a colour conversion resonator system, comprising: a first partially reflective region configured to transmit light of a first primary peak wavelength and to reflect light of a second primary peak wavelength; a second partially reflective region configured to at least partially transmit light of the first and second primary peak wavelengths and to reflect light of a third primary peak wavelength; a third partially reflective region configured to at least partially reflect light with the third primary peak wavelength; a first colour conversion resonator cavity arranged to receive input light with the first primary peak wavelength through the first partially reflective region and to convert at least some of the light of the first primary peak wavelength to provide light of the second primary peak wavelength, wherein the first colour conversion resonator cavity is arranged such that the second primary peak wavelength resonates in the first colour conversion resonator cavity and resonant light with the second primary peak wavelength is output through the second partially reflective region; and a second colour conversion resonator cavity arranged to receive input light comprising the second primary peak wavelength through the second partially reflective region and to convert at least some of the second primary peak wavelength to provide light of the third primary peak wavelength, wherein the second colour conversion resonator cavity is arranged such that the third primary peak wavelength resonates in the second colour conversion resonator cavity and resonant light with the third primary peak wavelength is output through the third partially reflective region, wherein the first colour conversion resonator cavity and the second resonator cavity are arranged partially to overlap to provide a non-overlapping portion and an overlapping portion thereby to define a first light emitting surface and a second light emitting surface respectively, wherein the first light emitting surface is arranged to provide resonant light of the second primary peak wavelength and the second light emitting surface is arranged to provide resonant light of the third primary peak wavelength.

Preferably, the third partially reflective region is further configured to reflect light with a fourth primary peak wavelength, the colour conversion resonator system further comprising: a fourth partially reflective region configured to at least partially reflect light with the fourth primary peak wavelength; and a third colour conversion resonator cavity arranged to receive input light comprising the third primary peak wavelength through the third partially reflective region and to convert at least some of the third primary peak wavelength to provide light of the fourth primary peak wavelength, wherein the third colour conversion resonator cavity is arranged such that the fourth primary peak wavelength resonates in the third colour conversion resonator cavity and resonant light with the fourth primary peak wavelength is output through the fourth partially reflective region, wherein the second colour conversion resonator cavity and the third colour conversion resonator cavity are arranged partially to overlap to provide a non-overlapping portion and an overlapping portion thereby to define the second light emitting surface and a third light emitting surface respectively, wherein the second light emitting surface is arranged to provide resonant light of the third primary peak wavelength and the third light emitting surface is arranged to provide resonant light of the fourth primary peak wavelength.

Such a configuration forms a monolithic system of epitaxial layers. In contrast to known monolithic LED devices, the colour conversion resonator system of the present invention is able to provide distinct light of different wavelengths in a vertically integrated system. Growing such a colour conversion resonator system monolithically removes the need to use conventional time consuming 'pick and place' methods whereby LEDs are grown individually on a wafer and moved separately onto the display electronics. Furthermore, the partial overlap created between the first and second colour conversion resonator cavities and the second and third colour conversion resonator cavities due to selective etching, allows the system to emit light of different colours with relatively narrow full width half maximum (FWHM) spectra. Furthermore, such a system improves the directionality of light emitted, reducing the need for the integration of collimators or lens, which may require complex processes to implement. Advantageously, improved light output is provided, enabling narrow beam angles and narrow spectra, for example for use in near eye displays. Beneficially, the colour conversion resonator system enables high colour gamut displays and the formation of high resolution micro LED arrays. Advantageously, the optical colour conversion resonator system enables wafer level processing and narrow beam angle emission without collimators, and compressed light emission spectra with reduced efficiency loss.

The colour conversion resonator system can be configured to emit red, green and blue light from the different light emitting surfaces. Such a system is particularly useful in microLED applications for display screens.

Preferably, the first partially reflective region and the second partially reflective region are separated by a distance of (N+1) multiplied by $\lambda_{converted}/2n(\lambda_{converted})$, wherein N is an positive integer number, $\lambda_{converted}$ is the second primary peak wavelength and $n(\lambda_{converted})$ is the effective refractive index of the material separating the first partially reflective region and the second partially reflective region, thereby to define the length of the first colour conversion resonator cavity and/or wherein the second partially reflective region and the third partially reflective region are separated by a distance of (N+1) multiplied by $\lambda_{converted}/2n(\lambda_{converted})$, wherein N is an positive integer number, $\lambda_{converted}$ is the third primary peak wavelength and $n(\lambda_{converted})$ is the effective refractive index of the material separating the second partially reflective region and the third partially reflective region, thereby to define the length of the second colour conversion resonator cavity, and/or wherein the third partially reflective region and the fourth partially reflective region are separated by a distance of (N+1) multiplied by $\lambda_{converted}/2n(\lambda_{converted})$, wherein N is an positive integer number, $\lambda_{converted}$ is the fourth primary peak wavelength and $n(\lambda_{converted})$ is the effective refractive index of the material separating the third partially reflective region and the fourth partially reflective region, thereby to define the length of the third colour conversion resonator cavity.

Such a configuration enables constructive interference of the second primary peak wavelength in the first colour conversion resonator cavity, constructive interference of the third primary peak wavelength in the second colour conversion resonator cavity and constructive interference of the fourth primary peak wavelength in the third colour conversion resonator cavity. Advantageously, careful tuning of the colour conversion resonator cavity enables enhanced output emission.

Preferably, the colour conversion resonator system further comprises at least one LED. More preferably, the colour conversion resonator system comprises a first LED arranged to control light emission from the first light emitting surface and a second LED arranged to control light emission from the second light emitting surface.

More preferably, the colour conversion resonator system comprises a first LED arranged to control light emission from the first light emitting surface, a second LED arranged to control light emission from the second light emitting surface and a third LED arranged to control light emission from the third light emitting surface. Beneficially, such a system allows each pixel to be controlled individually.

For example, a system with at least three individual LEDs and configured to emit red, green and blue light can allow only a blue pixel to emit light, or only a green pixel to emit light or only a red pixel to emit light. Additionally, a combination of the pixels can emit light such that blue and green light is emitted in combination, blue and red light is emitted in combination, red and green light is emitted in combination or red, green and blue light is emitted in combination.

Preferably the input light is at least one of ultra violet (UV) light and blue light, preferably wherein the input light has a wavelength of between 340 nm and 460 nm. Advantageously, high quality, established input LED sources with shorter wavelengths than the wavelength of further visible light colours required for optical displays are used to provide an input pump source for the colour conversion in the colour conversion resonator cavity.

Preferably, at least one of the colour conversion resonator cavities comprises at least one quantum well layer, preferably wherein the at least one quantum well layer is placed to coincide with an antinode of the colour conversion resonator cavity standing wavelength for converted light, thereby enhancing at least one of the intensity, spectral width and directionality of output light with the resonant converted wavelength of light.

Alternatively or additionally, there is provided the colour conversion resonator system wherein at least one of the colour conversion resonator cavities comprises a quantum well layer comprising at least one quantum well and a further quantum well layer comprising at least one quantum well, wherein the separation of the quantum well layer and the further quantum well layer is N multiplied by $\lambda_{converted}/2n(\lambda_{converted})$, wherein N is an positive integer number, $\lambda_{converted}$ is the wavelength of the resonant light in the colour conversion resonator cavity and $n(\lambda_{converted})$ is the effective refractive index of the material between the quantum well layer and the further quantum well layer at the wavelength of the resonant light in the colour conversion resonator cavity.

Beneficially, such a configuration places each quantum well layer at an antinode of the resonant standing wavelength of light in the colour conversion resonator cavities thereby enabling constructive interference and enhancement of output light.

Preferably, at least one of the colour conversion resonator cavities comprises at least one absorption layer configured to absorb input light thereby to enable transfer of energy from the input light wavelength into the at least one quantum well layer, preferably wherein the absorption layer comprises a material with a lower energy bandgap than the energy of the input light. Advantageously, absorption layers aid the process of enabling carriers to recombine in quantum well layers and thus enabling improved resonance of the converted light emitted by the quantum well layers.

Preferably, the colour conversion resonator system further comprises at least one diffusion barrier arranged to reduce diffusion of carriers from at least one of the colour conversion resonator cavities. Advantageously, the use of diffusion barriers reduces diffusion of carriers and hence enhances emissive recombination in the colour conversion resonator cavity.

Preferably, the colour conversion resonator system comprises at least one further partially reflective region corresponding to at least one of the first, second or third light emitting surfaces. Advantageously, the partially reflective regions are tuned in order to optimise which wavelengths are emitted by light emitting pixels formed by the combination of colour conversion resonator cavity systems and LED devices. Beneficially, light of predefined wavelengths is recycled in the colour conversion resonator cavities in order to enhance the conversion efficiency of input light with a primary peak wavelength to output light with a different primary peak wavelength.

Preferably, at least one of the partially reflective regions and/or the further partially reflective regions comprises a distributed Bragg reflector (DBR), preferably wherein the DBR is at least one of: a double band DBR, a conventional DBR and a vertical stack of two DBRs.

Preferably, at least one of the partially reflective regions comprises a blue wavelength centred low Herpin index distributed Bragg reflector (DBR) or a green wavelength centred low Herpin index DBR or a red wavelength centred low Herpin index DBR.

Preferably, the colour conversion resonator system comprises a blue wavelength centred low Herpin index DBR and a green wavelength centred low Herpin index DBR and a red wavelength centred low Herpin index DBR. Beneficially, such a configuration creates one pixel optimised for blue wavelength light, one pixel optimised for green wavelength light and one pixel optimised for red wavelength light.

Preferably, at least one of the partially reflective regions and the colour conversion resonator cavities comprises an epitaxial crystalline layer, preferably wherein the colour conversion resonator system comprises at least one of a dielectric material and a III-V semiconductor material. Advantageously, the partially reflective region is formed using techniques that enable seamless integration of the functional layers in the colour conversion resonator cavity.

Preferably, the colour conversion resonator system forms an array of pixels, wherein the array comprises a first pixel configured to emit light of a different wavelength to a second pixel and a third pixel configured to emit light of a different wavelength to the first pixel and the second pixel. Preferably the first and/or second pixel and/or third pixel comprises a further partially reflective region corresponding to its light emitting surface. Advantageously, light emitting pixels based on the combination of light emitting devices, such as LED devices, and colour conversion resonator cavities means that high purity colour light emitting pixels can be formed on a scale that means that they can be implemented in high resolution micro scale arrays.

The colour conversion resonator system is preferably produced by forming at least one of the colour conversion resonator cavities on a substrate, preferably wherein forming at least one of the colour conversion resonator cavities on the substrate comprises epitaxial growth of a plurality of layers. The method further comprising forming at least one of the partially reflective regions on the substrate, preferably wherein forming at least one of the partially reflective regions on the substrate comprises sequentially forming at least one of the colour conversion resonator cavities and partially reflective regions on the substrate. The method preferably comprising bonding the colour conversion resonator system to at least one LED and selectively etching the colour conversion resonator system, thereby to provide the light emitting surfaces. Advantageously, forming a colour conversion resonator cavity on a substrate enables large scale formation of colour conversion resonator cavities for integration with light emitting devices. Beneficially, known growth and processing techniques are applied to form structures with high quality, low defect density, material that provides for efficient light input and light conversion for use in light emitting pixels.

Further aspects of the invention will be apparent from the description and the appended claims.

DETAILED DESCRIPTION OF AN EMBODIMENT OF THE INVENTION

A detailed description of embodiments of the invention is described, by way of example only, with reference to the figures, in which.

In order to address disadvantages associated with devices in the prior art at least as described above, a structure and method of forming the structure is described below, with reference to FIGS. 1 to 11. A colour conversion resonator cavity system is described that provides an elegant way to down convert and reuse input light in an efficient manner, in order to provide multi-colour wavelength light output systems. Advantageously, such systems provide high purity, narrow FWHM output light with narrower beam angles, thereby improving light output control and providing systems with a better colour gamut and controlled directionality. Beneficially, the formation and processing of epitaxially grown crystalline layers can be used to provide high quality, and therefore high efficiency, systems for improved light output. Such epitaxially grown crystalline layers can be used to form the colour conversion resonator cavity system in a single growth process or groups of one or more epitaxially grown crystalline layers can be optimised separately and bonded together to form the colour conversion resonator cavity, thereby enabling parallel growth and processing of separately optimised layers.

Further, advantageously, the formation and processing of colour conversion resonator cavities formed from epitaxially grown systems enables the definition of light emitting surfaces associated with the emission of different colours of light, whereby the light emitting surfaces are associated with pixels that can, advantageously, be formed on a scale suitable for implementation in microLED pixel arrays (including high resolution microLED arrays with light emitting surfaces of pixels less than or equal to 100 $\mu m^2$ and preferably less than or equal to 16 $\mu m^2$, and with pixel pitch less than or equal to 10 $\mu m$ and preferably less than or equal to 5 $\mu m$).

Figure 1:
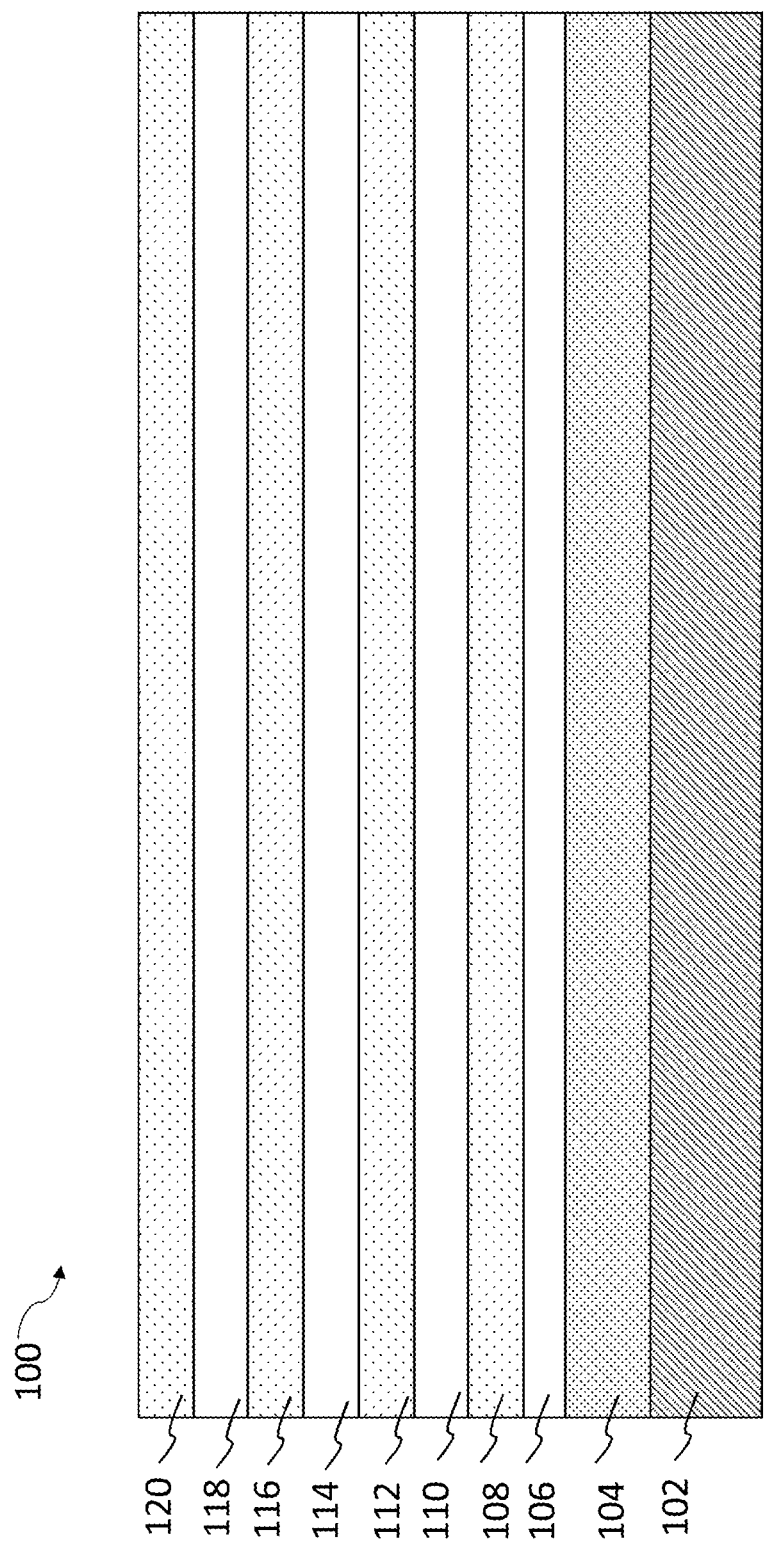
FIG. 1 shows a cross sectional view of a system of three colour conversion resonator cavities.

In FIG. 1 there is shown a cross sectional view of a colour conversion resonator system 100, which is an epitaxial structure that has three colour conversion resonator cavities. The epitaxial structure is formed and subsequently processed in order to provide a colour conversion resonator system in combination with light input devices, as described with reference to FIGS. 2 to 11.

The colour conversion resonator system 100 is a stack of epitaxial crystalline compound semiconductor layers. The epitaxial crystalline compound semiconductor layers are provided by sequential growth of the epitaxial layers on a growth substrate 102. The growth substrate 102, for example a silicon, silicon carbide, sapphire, gallium nitride, or other suitable growth substrate, may be removed after the epitaxial compound semiconductor crystalline layers have been formed. Beneficially, the growth of such epitaxial compound semiconductor crystalline layers formed in this manner can be controlled with high precision to provide high quality material with low defect densities, as well as controlled thicknesses of layers and efficient emissive recombination of carriers at controlled wavelengths of light.

The three colour conversion resonator cavities of the epitaxial structure are each designed to receive input light from one or more input light sources and to convert input light with a primary peak wavelength from an input light source to provide output light with different, converted, primary peak wavelengths of light. The epitaxial structure is designed such that light of the converted primary peak wavelength resonates in its respective colour conversion resonator cavity of the epitaxial structure and resonant converted light of multiple, different, wavelengths is output from the colour conversion resonator system 100 when processed and combined with input light sources. Appropriate processing of the epitaxial structure enables the provision of multi-colour emitters, where multiple colour conversion resonator cavities are associated with different light emitting surfaces for emitting light of different wavelengths, at least as described herein.

FIG. 1 shows a buffer 104 grown on the growth substrate 102. The substrate 102 is a silicon substrate and the buffer 104 an aluminium gallium nitride (AlGaN) epitaxial layer. In further examples, alternatively or additionally, the buffer 104 is formed of at least one of aluminium gallium nitride (AlGaN), aluminium nitride (AlN), and gallium nitride (GaN).

Upon the buffer 104 there is grown an etch stop 106. The etch stop 106 is an AlGaN layer with relatively high aluminium content. The etch stop 106 facilitates accurate control of processing steps that are used to remove material from the epitaxial structure 100 in order to provide a processed system.

Atop the etch stop 106 there is grown a partially reflective region 108. Upon the partially reflective region 108 there is grown a colour conversion resonator cavity 110 and a further partially reflective region 112. The colour conversion resonator cavity 110 is configured to receive input light of a primary peak wavelength and convert this input light to converted light of a different primary peak wavelength.

Atop the partially reflective region 112 there is grown a further colour conversion resonator cavity 114 and a further partially reflective region 116. The colour conversion resonator cavity 114 is configured to receive input light of another primary peak wavelength and convert this input light to converted light of a different primary peak wavelength. In a further example, an etch stop layer is formed between the partially reflective region 112 and the further colour conversion resonator cavity 114. The etch stop layer (not shown) facilitates close control in subsequent steps to remove material from the structure. In further examples, alternative or additional etch stop layers are formed within the structure in order to facilitate control of removal of layers by etching processes.

Atop the partially reflective region 116 there is grown a further colour conversion resonator cavity 118 and a further partially reflective region 120. The colour conversion resonator cavity 118 is configured to receive input light of a further primary peak wavelength and convert this input light to converted light of a different primary peak wavelength. In a further example, an etch stop layer is formed between the partially reflective region 116 and the further colour conversion resonator cavity 118. The etch stop layer (not shown) facilitates close control in subsequent steps to remove material from the structure. In further examples, alternative or additional etch stop layers are formed within the structure in order to facilitate control of removal of layers by etching processes.

Colour conversion resonator system 100 forms a monolithic system of epitaxial layers. Such epitaxial layers are planar layers. The colour conversion resonator system 100 of FIG. 1 is formed using epitaxial compound semiconductor growth techniques such as metalorganic chemical vapour deposition (MOCVD) and molecular beam epitaxy (MBE). Additionally, or alternatively, the colour conversion resonator system 100 is formed using any appropriate technique.

The order of the epitaxial layers is sequentially grown such that when the system is flipped and bonded to an LED, the order of proximity of the colour conversion resonator cavities with respect to the LED is such that shorter wavelength light, such as UV light, from the LED is absorbed in the colour conversion resonator cavity 118 and then longer wavelength light, such as blue light, is output from the colour conversion resonator cavity 118. The light output from the colour conversion resonator cavity 118 and the LED is absorbed in the colour conversion resonator cavity 114. The colour conversion resonator cavity 114 then outputs light with a longer wavelength than the LED and the colour conversion cavity 118, such as green light. Light output from the colour conversion resonator cavity 118, the colour conversion resonator cavity 114 and the LED is absorbed in the colour conversion resonator cavity 110, which then outputs yet longer wavelength light, such as red light. This means that input light can be absorbed and emitted by the colour conversion resonator cavities in such a way that the light that is emitted by the successive colour conversion resonator cavities is reused before exiting the eventual structure.

Advantageously, growing the epitaxial structure of the colour conversion resonator system 100 in this order means that the colour conversion resonator cavities 118, 114, 110 can be handled using the growth substrate 102 upon which the layers of the colour conversion resonator system 100 are formed, in order to facilitate bonding with LED structures without requiring further processing steps to enable alignment and bonding of the colour conversion resonator system 100 with one or more light emitting devices formed on a different underlying substrate.

The colour conversion resonator system 100 described with respect to FIG. 1 is formed from nitride-based materials. In particular, the epitaxial crystalline compound semiconductor layers are Gallium Nitride (GaN) based materials. Whilst the structures described in relation to FIG. 1 relate to nitride-based semiconductor compound materials, the skilled person understands that the concepts described herein are applicable to other materials, in particular to other semiconductor materials, for example other III-V compound semiconductor materials, or II-VI compound semiconductor materials.

The provision of three colour conversion resonator cavities enables structures that emit multiple, different, primary peak wavelengths of light to be formed. The skilled person understands that alternative or additional structures are used in further examples in order to provide different structures that emit different primary peak wavelengths of light.

The partially reflective region 108 and the further partially reflective region 112 are separated by a distance of (N+1) multiplied by $\lambda_{converted}/2n(\lambda_{converted})$ wherein N is an positive integer number, $\lambda_{converted}$ is the converted primary peak wavelength emitted from the colour conversion resonator cavity 110 and $n(\lambda_{converted})$ is the effective refractive index of the material separating the partially reflective region 108 and the further partially reflective region 112. Such a configuration allows light of the converted primary peak wavelength to resonate in the colour conversion resonator cavity 110. In further examples, the partially reflective region 108 and the further partially reflective region 112 are separated by a different distance.

Similarly, the partially reflective region 112 and the further partially reflective region 116 are separated by a distance of (N+1) multiplied by $\lambda_{converted}/2n(\lambda_{converted})$ wherein N is an positive integer number, $\lambda_{converted}$ is the converted primary peak wavelength emitted from the colour conversion resonator cavity 114 and $n(\lambda_{converted})$ is the effective refractive index of the material separating the partially reflective region 112 and the further partially reflective region 116. Such a configuration allows light of the converted primary peak wavelength to resonate in the colour conversion resonator cavity 114. In further examples, the partially reflective region 112 and the further partially reflective region 116 are separated by a different distance.

Additionally, the partially reflective region 116 and the further partially reflective region 120 are separated by a distance of (N+1) multiplied by $\lambda_{converted}/2n(\lambda_{converted})$, wherein N is an positive integer number, $\lambda_{converted}$ is the converted primary peak wavelength emitted from the colour conversion resonator cavity 118 and $n(\lambda_{converted})$ is the effective refractive index of the material separating the partially reflective region 116 and the further partially reflective region 120. Such a configuration allows light of the converted primary peak wavelength to resonate in the colour conversion resonator cavity 118. In further examples, the partially reflective region 116 and the further partially reflective region 120 are separated by a different distance.

The colour conversion resonator cavity 110 comprises at least one quantum well layer. The quantum well layer comprises multiple quantum wells. In further examples, the quantum well layer comprises a single quantum well. The quantum well layer is placed at an antinode of the colour conversion resonator cavity standing wavelength for the converted primary peak wavelength emitted from the colour conversion resonator cavity 110. Similarly, the colour conversion resonator cavity 114 comprises at least one quantum well layer, placed at an antinode of the colour conversion resonator cavity standing wavelength for the converted primary peak wavelength emitted from the colour conversion resonator cavity 114. The quantum well layer comprises multiple quantum wells. In further examples, the quantum well layer comprises a single quantum well. Additionally, the colour conversion resonator cavity 118 comprises at least one quantum well layer, placed at an antinode of the colour conversion resonator cavity standing wavelength for the converted primary peak wavelength emitted from the colour conversion resonator cavity 118. The quantum well layer comprises multiple quantum wells. In further examples, the quantum well layer comprises a single quantum well. Such a configuration enhances at least one of the intensity, spectral width and output light with the resonant converted primary peak wavelengths. In further examples, the colour conversion resonator cavities 110, 114, 118 each have alternative or additional layers, for example single or multiple quantum wells in the quantum well layers are positioned to coincide with different antinodes of the converted wavelength of light in the respective colour conversion resonator cavities 110, 114, 118.

The colour conversion resonator cavities 110, 114 and 118 each comprise multiple quantum wells (MQWs). In further examples, the colour conversion resonator cavities 110, 114, 118 each comprise a single quantum well (SQW). In further examples, the colour conversion resonator cavities 110, 114, 118 comprise different layers from one another. The quantum well layers are designed to enable carriers to recombine such that emissive recombination results in an output of light with a primary peak wavelength that is different to the wavelength of input light that results in the emission of the output light.

In order to enable emission, input light is absorbed by absorption layers associated with respective quantum well layers in each of the colour conversion resonator cavities 110, 114, 118. The input light absorbed at the absorption layers has a primary peak wavelength. In an example, the input light is blue light with a wavelength of approximately 450 nm. The wavelength of light output by the quantum well layers is longer than the wavelength input. The output wavelength of light is the converted wavelength of light. Whilst the input light is blue light, in further examples, additional or alternative wavelengths of input light are used. More preferably, each absorption layer comprises material with a lower energy bandgap than the energy of the input primary peak wavelength.

The epitaxial structure of the colour conversion resonator system 100, once formed, is designed to be inverted and bonded to light emitting devices and the substrate 102, buffer 104 and etch stop 106 removed. Accordingly, the order of the sequence of layers of input light and subsequent, converted, output light in the epitaxial structure of the colour conversion resonator system 100 is considered before growth and the formation of the partially reflective regions is described in more detail with respect to FIGS. 2 and 3, below. The partially reflective regions 108, 112, 116 and 120 are Distributed Bragg Reflectors (DBRs). In further examples, the partially reflective regions 108, 112, 116 and 120 comprise alternative or additional structures.

Figure 2:
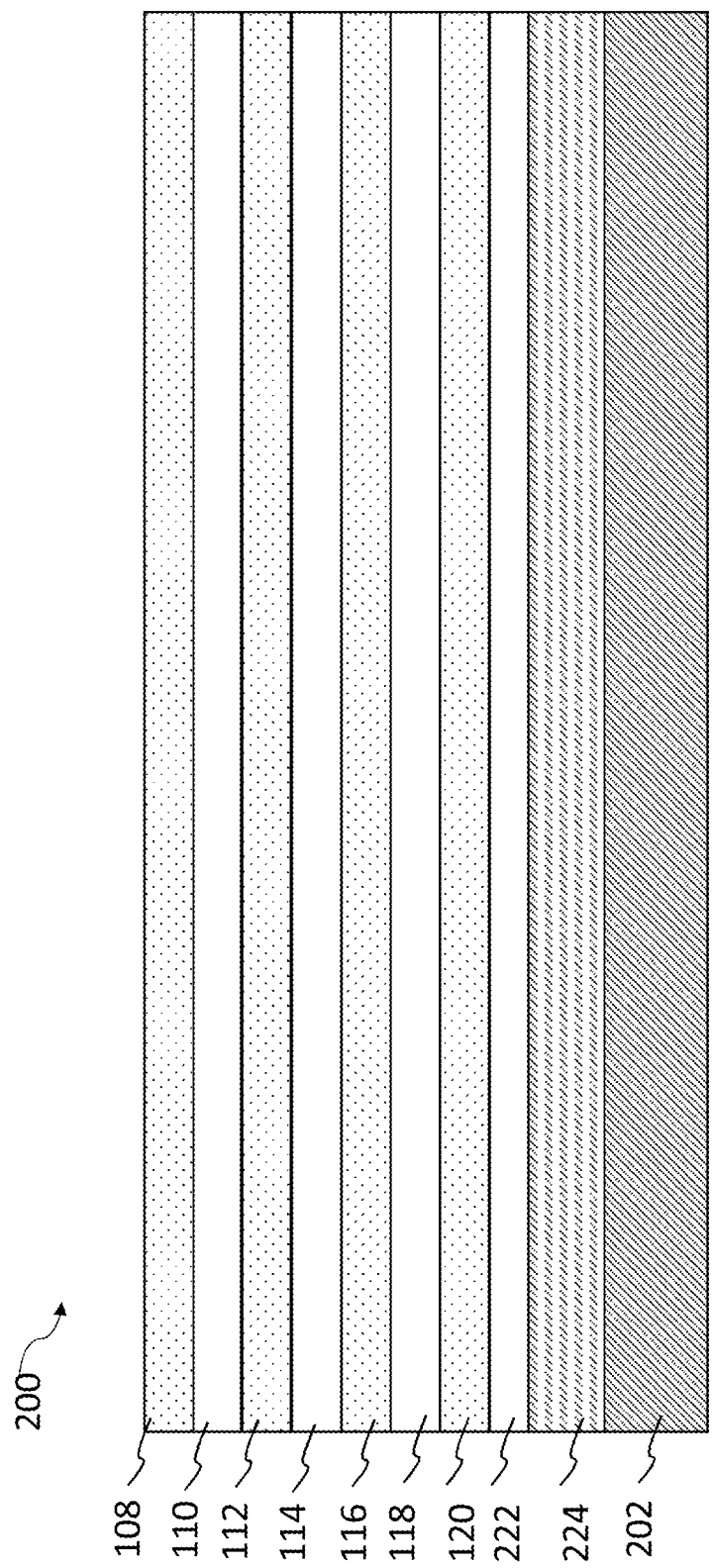
FIG. 2 shows a cross sectional view of the system of FIG. 1 wherein the colour conversion resonator cavities are bonded to an LED.

Once the system 100 has been formed, it is inverted and bonded to an LED structure. This is shown at FIG. 2. In FIG. 2 there is shown a colour conversion resonator system 200 that comprises a light emitting diode (LED) 224 and substrate device 202. The substrate device is a temporary substrate used to facilitate the processing of the colour conversion resonator system 200. Alternatively, in an example, the substrate device 202 is a complementary metal oxide semiconductor (CMOS) backplane that is combined with light emitting devices, such as light emitting diode devices, in order to provide and control input light in the eventual structure. The colour conversion resonator system 100 described with respect to FIG. 1 is combined with the substrate device 202 and the LED 224 by inverting the colour conversion resonator structure 100 described with reference to FIG. 1 and bonding the uppermost partially reflective region 120 epitaxial layer to the LED 224 using a bonding layer 222. The substrate 102, buffer, 104 and etch stop 106 are then removed, leaving the structure shown at FIG. 2.

Advantageously, the order of proximity of the colour conversion resonator cavities with respect to the LED 224 is such that shorter wavelength light, such as blue light, from the LED 224 is absorbed in the first colour conversion resonator cavity, then light output from the first colour conversion resonator cavity and the LED 224 is absorbed in the second colour conversion resonator cavity, and light output from the first colour conversion resonator cavity, the second colour conversion resonator cavity and the LED 224 is absorbed in the third colour conversion resonator cavity. This means that input light can be absorbed and emitted by the colour conversion resonator cavities in such a way that the light that is emitted by the colour conversion resonator cavities is reused before exiting the eventual structure.

Accordingly the partially reflective region 120 is shown directly atop the bonding layer 222 on the LED 224. On top of the partially reflective region 120 is the colour conversion resonator cavity 118 followed by the further partially reflective region 116. On top of the partially reflective region 116 is the further colour conversion resonator cavity 114 followed by the further partially reflective region 112. On top of the partially reflective region 112 is the further colour conversion resonator cavity 110 followed by the further partially reflective region 108.

Whilst the colour conversion resonator system 100 of FIG. 1 is processed in order to bond to the LED 224, as shown in FIG. 2, in further examples, the epitaxial layers of the colour conversion resonator system 200 are grown directly on the LED 224. Beneficially, such direct growth of layers atop the LED 224 prevent later bonding steps in the manufacture of such devices.

Whilst the epitaxial layers of the colour conversion resonator system 100 described with reference to FIG. 1 are shown to be grown in a particular order in order to enable bonding of the structure to a light emitting diode structure, in further examples, the order of growth is reversed in order to preserve the efficient absorption and emission of light from shorter to longer wavelengths from the colour conversion resonator cavity nearest to the input LED light source to the colour conversion resonator cavity furthest from the input LED.

In FIG. 2 there is shown a colour conversion resonator system 200. As described above, the colour conversion resonator system 200 is formed by inverting the colour conversion resonator system 100 and bonding the colour conversion resonator system 100 to the LED 224 via the bonding layer 222 such that the partially reflective region 120 is bonded directly atop the LED 224 and the bonding layer 222, and such that the partially reflective region 108 is at the top of the colour conversion resonator system 200 and subsequently removing the substrate 102 and the buffer 104 from the colour conversion resonator system 200. The colour conversion resonator system 100 may be inverted by handling the substrate 102 and the buffer 104 of the colour conversion resonator system 100 before removing said layers.

The LED 224 is bonded to the partially reflective region 120 using dielectric bonding. The surface of the LED 224 that is to be bonded to the partially reflective region 120 is terminated with a high density oxide film in order to facilitate such bonding. The surface of the partially reflective region 120 that is to be bonded to the input LED 224 is also terminated with a high density oxide film in order to facilitate wafer level oxide bonding. Accordingly, the primary light emitting surface of the LED 224 is placed in close proximity or contact with the partially reflective region 120 such that light that is output from the LED 224 acts as input light for the colour conversion resonator system 200.

In further examples, the LED 224 is bonded to the partially reflective region 120 using polymer bonding, such as polyimide bonding. In further examples, additional or alternative bonding mechanisms are used in order to attach the LED 224 to the partially reflective region 120. Advantageously, the LED 224 is bonded to the partially reflective region 120 to form a single device with minimal interface loss of light emission from the LED 224 at the interface with the colour conversion resonator system 200.

The colour conversion resonator system 200 is configured to receive input light of a first primary peak wavelength and convert this input light to light of a second primary peak wavelength. The colour conversion resonator system 200 further converts light of the second primary peak wavelength (and light of the first primary peak wavelength) to light of a third primary peak wavelength. Light of the third primary peak wavelength (and the first and second primary peak wavelengths) is then converted to light of a fourth primary peak wavelength.

Such a set up allows the colour conversion resonator cavity 118 to receive input light of the first primary peak wavelength from the LED 224 before the further colour conversion resonator cavities 114 and 110. This is efficient when the colour conversion resonator cavity 118 is configured for resonant light of the second primary peak wavelength wherein this wavelength is less than the third primary peak wavelength and the fourth primary peak wavelength. The third primary peak wavelength is greater than the second primary peak wavelength and less than the fourth primary peak wavelength.

For example, the colour conversion resonator cavity 118 can be optimised for a wavelength of light corresponding to blue light (e.g., approximately 450 nm whereby the input light has a shorter wavelength, e.g., UV light at approximately 380 nm), the further colour conversion resonator cavity 114 can be optimised for a wavelength of light corresponding to green light (e.g., approximately 530 nm, whereby the input light has a shorter wavelength, e.g., blue light and UV light), and the further colour conversion resonator cavity 110 can be optimised for a wavelength of light corresponding to red light (e.g., approximately 630 nm, whereby the input light has a shorter wavelength, e.g., green light, blue light and UV light).

In order to enable resonance of wavelengths of light, the partially reflective regions 108, 112, 116, 120 are configured to improve the passage of light through the colour conversion resonator system 200 from the light input LED 224 to a light emitting surface.

The partially reflective region 120 has a relatively high reflectivity for the wavelength of converted light generated in the colour conversion resonator cavity 110 and a relatively high transmissivity for the wavelength of the input light. In an example, the partially reflective region 120 has a relatively low reflectivity, e.g., less than 20% of the primary peak wavelength of the input light from the LED 224 bonded to the partially reflective region 120 and a relatively high reflectivity, e.g., more than 80%, of converted light generated by absorption of the input light and re-emission in the colour conversion resonator cavity 118. In further examples, different reflectivity values are used for the partially reflective region 120. In an example, the partially reflective region 120 has a reflectivity of input light of less than 10% and a reflectivity of converted light of greater than 90%. In a further example, the partially reflective region 120 has a reflectivity of input light of less than 5% and a reflectivity of converted light of greater than 95%. Similarly, the partially reflective region 116 has a relatively high reflectivity for the wavelength of converted light generated in the colour conversion resonator cavity 114 and a relatively high transmissivity for the wavelength of the input light.

In an example, the partially reflective region 116 has a relatively low reflectivity, e.g., less than 20% of the primary peak wavelength of the input light and a relatively high reflectivity, e.g., more than 80%, of converted light generated by absorption of the input light and re-emission in the colour conversion resonator cavity 114. In further examples, different reflectivity values are used for the partially reflective region 116. In an example, the partially reflective region 116 has a reflectivity of input light of less than 10% and a reflectivity of converted light of greater than 90%. In a further example, the partially reflective region 116 has a reflectivity of input light of less than 5% and a reflectivity of converted light of greater than 95%. Additionally, the partially reflective region 112 has a relatively high reflectivity for the wavelength of converted light generated in the colour conversion resonator cavity 110 and a relatively high transmissivity for the wavelength of the input light.

In an example, the partially reflective region 112 has a relatively low reflectivity, e.g., less than 20% of the primary peak wavelength of the input light and a relatively high reflectivity, e.g., more than 80%, of converted light generated by absorption of the input light and re-emission in the colour conversion resonator cavity 110. In further examples, different reflectivity values are used for the partially reflective region 112. In an example, the partially reflective region 112 has a reflectivity of input light of less than 10% and a reflectivity of converted light of greater than 90%. In a further example, the partially reflective region 112 has a reflectivity of input light of less than 5% and a reflectivity of converted light of greater than 95%.

In an example, the partially reflective region 108 has a relatively low reflectivity, e.g., less than 20% of the primary peak wavelength of the input light and a relatively high reflectivity, e.g., more than 80%, of converted light generated by absorption of the input light and re-emission in the colour conversion resonator cavity 110. In further examples, different reflectivity values are used for the partially reflective region 108. In an example, the partially reflective region 108 has a reflectivity of input light of less than 10% and a reflectivity of converted light of greater than 90%. In a further example, the partially reflective region 108 has a reflectivity of input light of less than 5% and a reflectivity of converted light of greater than 95%.

The partially reflective regions 108, 112, 116 and 120 are formed from alternating epitaxial crystalline layers of different refractive indices. The refractive indices of the layers, and the thicknesses of the layers, are selected in order to provide a reflectivity response as a function of the wavelength of light incident at the partially reflective regions 108, 112, 116 and 120. Growth of a DBR in this manner enables seamless formation of a high crystalline quality colour conversion resonator system 100.

Whilst the partially reflective regions 108, 112, 116 and 120 are DBRs, in further examples, alternative or additional regions are used. In a further example, the partially reflective region 108 comprises a DBR or a vertical stack of two different DBRs or a double band DBR. In a further example, the partially reflective region 108 is omitted. In a further example, the partially reflective region 112 and/or the partially reflective region 116 and/or the partially reflective region 120 comprise a DBR with relatively high reflectivity of converted wavelengths of light and low reflectivity of input wavelengths. or example, as a filter for high reflectivity of blue light and low reflectivity of green and red light, or as a filter for low reflectivity of blue light and high reflectivity of green and red light. Reflectivity of light either side of a range of wavelengths may also be implemented. Where defines a quarter wavelength thick, high refractive index material, defines a quarter wavelength thick, low refractive index material, for N layers, a $$\left(\frac{L}{2}H\frac{L}{2}\right)^N \text{ and } \left(\frac{H}{2}L\frac{H}{2}\right)^N$$

stack can be used to suppress the reflectivity of the short and long wavelength side, respectively, a $$\left(\frac{H}{2}L\frac{H}{2}\right)^N$$

stack can be used as a filter for high reflectivity of blue light and low reflectivity of green and red light and a $$\left(\frac{L}{2}H\frac{L}{2}\right)^N$$

stack can be used as a filter for low reflectivity of blue light and high reflectivity of green and red light. In other examples, other arrangements are used selectively to filter light.

Whilst the partially reflective regions 108, 112, 116 and 120 are DBRs formed of nitride-based epitaxial layers, in further examples the partially reflective regions 108, 112, 116 and 120 are additionally, or alternatively formed using different methods whilst maintaining the functionality of enabling reflection of some wavelengths of light and transmission of different wavelengths of light. For example, the partially reflective region 108 and/or the partially reflective region 112 and/or the partially reflective region 116 and/or the partially reflective region 120 are/is formed from dielectric stacks. In a further example, the partially reflective region 108 and/or the partially reflective region 112 and/or the partially reflective region 116 and/or the partially reflective region 120 are/is formed from alternating layers of GaN and porous GaN. The porosity of the epitaxial crystalline GaN layers forming the partially reflective regions 108, 112, 116 and 120 is controlled in order to provide the desired reflectivity response as a function of wavelength, since the porosity of the epitaxial crystalline layers is linked to their refractive index. Advantageously, DBRs formed in this manner can be provided using GaN alone.

Preferably, there is provided at least one diffusion barrier arranged to reduce diffusion of carriers from the colour conversion resonator cavities 110, 114 and 118. Diffusion barriers are incorporated in the structure in order to enhance resonant light emission of converted light in the colour conversion resonator cavities.

Figure 3:
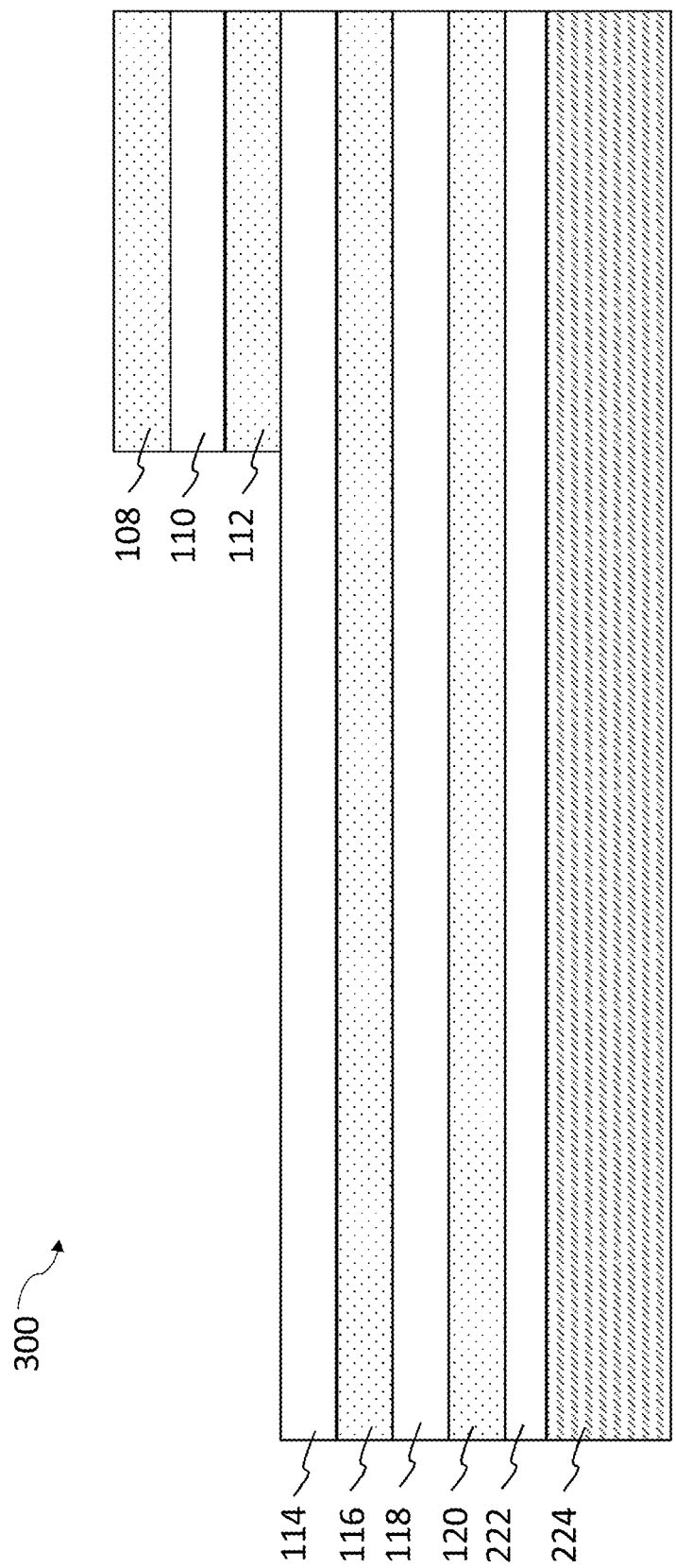
FIG. 3 shows a cross sectional view of the system of three colour conversion resonator cavities of FIG. 2 that has been processed further.

In FIG. 3 there is shown a colour conversion resonator system 300 comprising the LED 224, the bonding layer 222, the partially reflective region 120, the colour conversion resonator cavity 118, the further partially reflective region 116 and the further colour conversion resonator cavity 114. Each of these layers is grown sequentially as described above (e.g., either in the order shown in FIG. 1 and flipped, or in the order shown in FIG. 2, without being flipped). Atop this series of layers partially etched layers from the structure described with respect to FIGS. 1 and 2 is shown. The etched layers are the partially reflective region 112, the colour conversion resonator cavity 110 and the partially reflective region 108. These layers have been etched such that said layers 108, 110 and 112 form a partially overlapping region with remaining layers 224, 222, 120, 118, 116 and 114.

The colour conversion resonator system 300 is formed by selectively etching the colour conversion resonator system 200 in a first region. The surface of the partially reflective region 108 is selectively patterned according to known techniques. Such selective patterning allows for selective etching of regions of the colour conversion resonator system (e.g., using known wet or dry etching techniques). As shown at FIG. 3, a first etch has removed the partially reflective regions 108, 112 and the colour conversion resonator cavity 110 from the colour conversion resonator system 200 in the first region. The use of an etch stop (not shown) between the colour conversion resonator cavity 114 and the partially reflective region 112 facilitates control of the removal of material by etching. In further examples, additionally or alternatively, the partially reflective region 112 is not removed during the first etch process. The first etch process forms a light emitting surface region associated with the partially reflective region 108. Whilst one region is shown as the partially reflective region 108, in further examples, multiple regions are etched to provide light emitting surfaces associated with the partially reflective region 108. Such multiple regions are used to form arrays.

Once the first etch process has been performed in order selectively to remove material associated with the colour conversion resonator cavity 110, a second etch process is performed. This is shown at FIG. 4.

Figure 4:
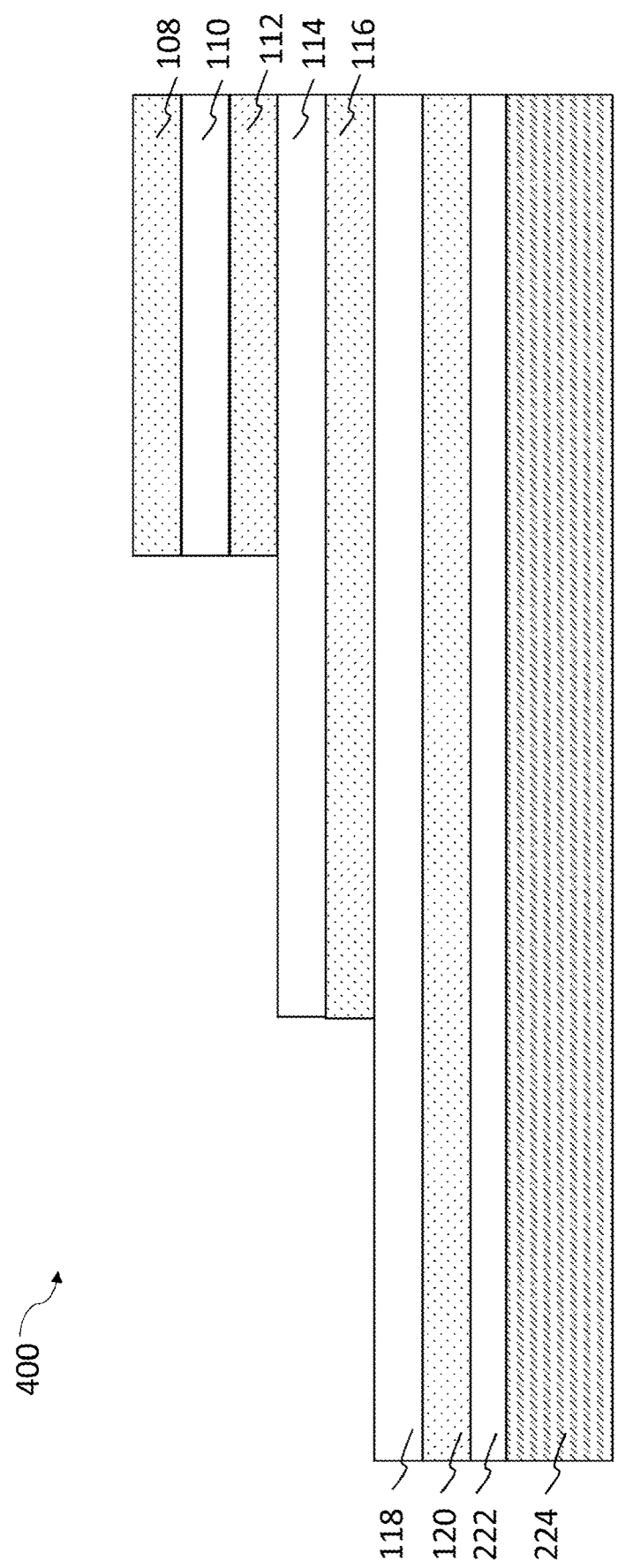
FIG. 4 shows a cross sectional view of the system of three colour conversion resonator cavities of FIG. 3 that has been processed further.

In FIG. 4 there is shown a colour conversion resonator system 400 comprising the LED 224, the bonding layer 222, the partially reflective region 120 and the colour conversion resonator cavity 118. These layers, grown sequentially, as described above, remain unetched. Atop said layers 224, 222, 120 and 118, is the partially reflective region 116 and the further colour conversion resonator cavity 114. The partially reflective region 116 and the colour conversion resonator cavity 114 have selectively been etched such that layers 114 and 116 form a partially overlapping region with remaining layers 224, 222, 120 and 118. As described above, atop layers 114 and 116 is the further partially reflective region 112, the further colour conversion resonator cavity 110 and the further partially reflective region 108 such that said layers 112, 110 and 108 form a partially overlapping region with layers 114 and 116. The use of an etch stop (not shown) between the colour conversion resonator cavity 118 and the partially reflective region 116 facilitates control of the removal of material by etching. In further examples, additionally or alternatively, the partially reflective region 116 is not removed during the second etch process. The second etch process forms an exposed light emitting surface region associated with the colour conversion resonator cavity 114 and an exposed light emitting surface region associated with the colour conversion resonator cavity 118. Whilst the etch process is described with respect to a cross-sectional view of three exposed regions associated with different layers of colour conversion resonator cavities, in further examples, multiple regions are etched to provide light emitting surfaces associated with different layers of colour conversion resonator cavities in order to form arrays, with two dimensional arrays of light emitting pixels, each light emitting pixel having an associated light emitting surface.

The colour conversion resonator system 400 is formed by etching the colour conversion resonator system 300 in a second region. A second etch has removed the partially reflective region 116 and the colour conversion resonator cavity 114 from the colour conversion resonator system 300 in the second region.

Beneficially, such a system creates a colour conversion resonator system 400 with light emitting surfaces associated with different regions, where the light emitting surfaces are provided by the exposed regions and enable light of three different primary peak wavelengths to be emitted from the colour conversion resonator system 400.

Figure 5:
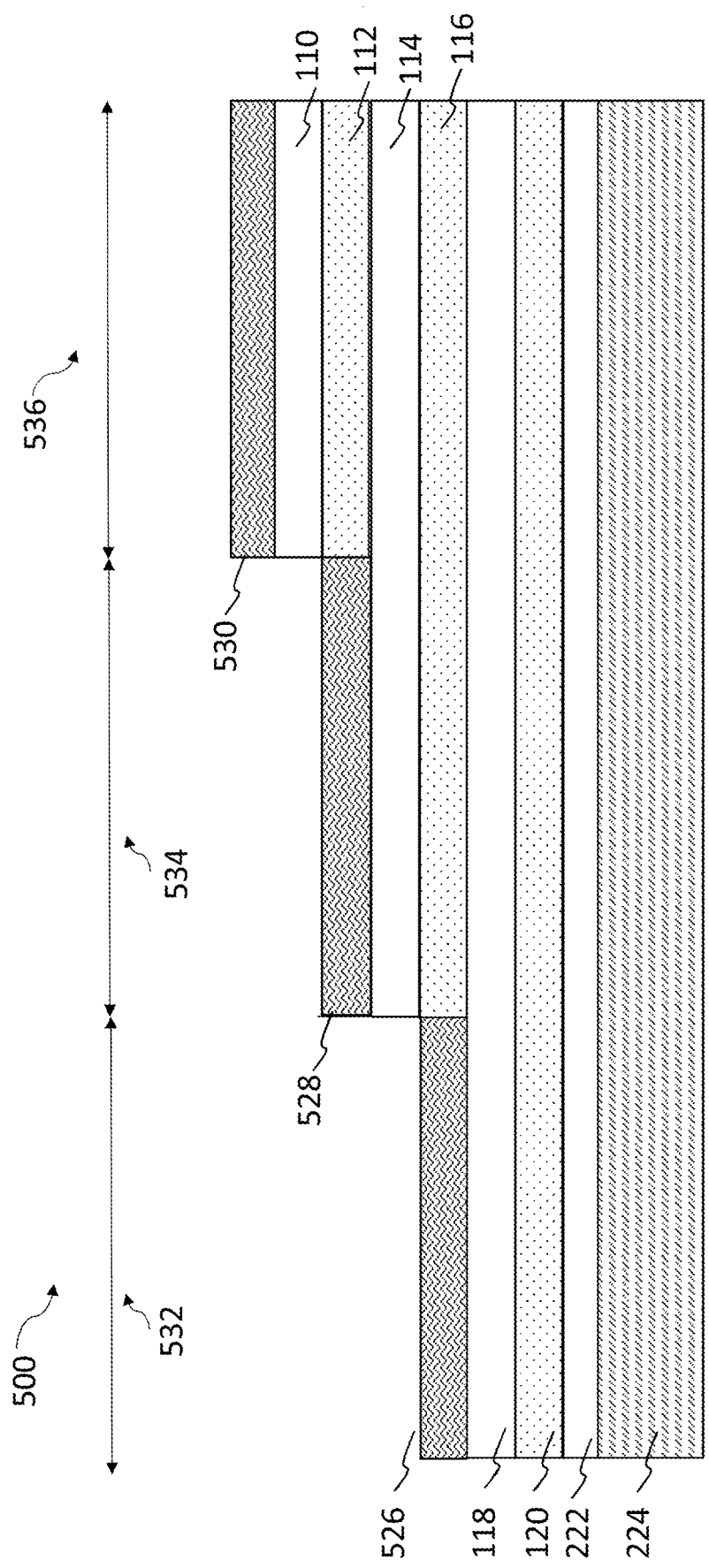
FIG. 5 shows a cross sectional view of the system of three colour conversion resonator cavities of FIG. 4 that has been processed further.

In FIG. 5 there is shown a colour conversion resonator system 500 where the colour conversion resonator system 400 described with reference to FIG. 4 has been further processed to provide a first further partially reflective region 526, a second further partially reflective region 528, and a third further partially reflective region 530. The third further partially reflective region 530 associated with the colour conversion resonator cavity 110 is provided instead of the partially reflective region 108 formed in the initial epitaxial structure. Alternatively, the partially reflective region 108 remains in place and the third further partially reflective region 530 is not formed in the structure shown at FIG. 5. The first further partially reflective region 526 is formed atop the exposed surface of the colour conversion resonator cavity 118. The second further partially reflective region 528 is formed atop the exposed surface of the colour conversion resonator cavity 114.

The partially reflective regions 108, 112, 116 and 120 and/or the further partially reflective regions 526, 528, 530 comprise a Distributed Bragg Reflector (DBR). Such a DBR is preferably one of a double band DBR, a conventional DBR and a vertical stack of two DBRs. More preferably, the partially reflective regions 112, 116 and 120 comprise a low Herpin index DBR whilst the partially reflective region 108 and the further partially reflective regions 526, 528 and 530 comprise a double band DBR, a conventional DBR and a vertical stack of two DBRs.

In an example, the partially reflective regions 108, 112, 116 and 120 comprises a blue wavelength centred low Herpin index DBR, or a green wavelength centred low Herpin index DBR, or a red wavelength centred low Herpin index DBR. For example, the partially reflective region 120 may have a blue wavelength centred low Herpin index DBR such that the first pixel is optimised for blue wavelength light. The partially reflective region 116 may have a green wavelength centred low Herpin index DBR such that the second pixel is optimised for green wavelength light. The partially reflective region 112 may have a red wavelength centred low Herpin index DBR such that the third pixel is optimised for red wavelength light.

Such a configuration provided by the colour conversion resonator system 500 enables light emitting surfaces to be provided in order to form arrays of pixels. The etching and deposition of partially reflective regions described above results in the creation of a first pixel with the first further partially reflective region 526 as a top layer, a second pixel with the second further partially reflective region 528 as a top layer and a third pixel with the third further partially reflective region 530 as a top layer. The first pixel has a pixel dimension 532. The second pixel has a pixel dimension 534. The third pixel has a pixel dimension 536. Whilst the pixel dimensions 532, 534, 534 are shown in cross section, the skilled person understands that the in plan view the pixels have exposed light emitting surfaces associated with the dimensions 532, 534, 536 (for example, pixels with square light emitting surface areas—in further examples, pixels of different forms of arrays and shaped light emitting surfaces are formed). Further, whilst the first and second partially reflective regions 526, 528 are shown to abut partially reflectively regions 116 and 112 respectively, in further examples, the first and second partially reflective regions 526 528 have different surface coverage. Further, whilst the relative thicknesses of the cross sectional image are shown in the Figures, the skilled person understands that in further examples the layers have different relative dimensions.

Figure 6:
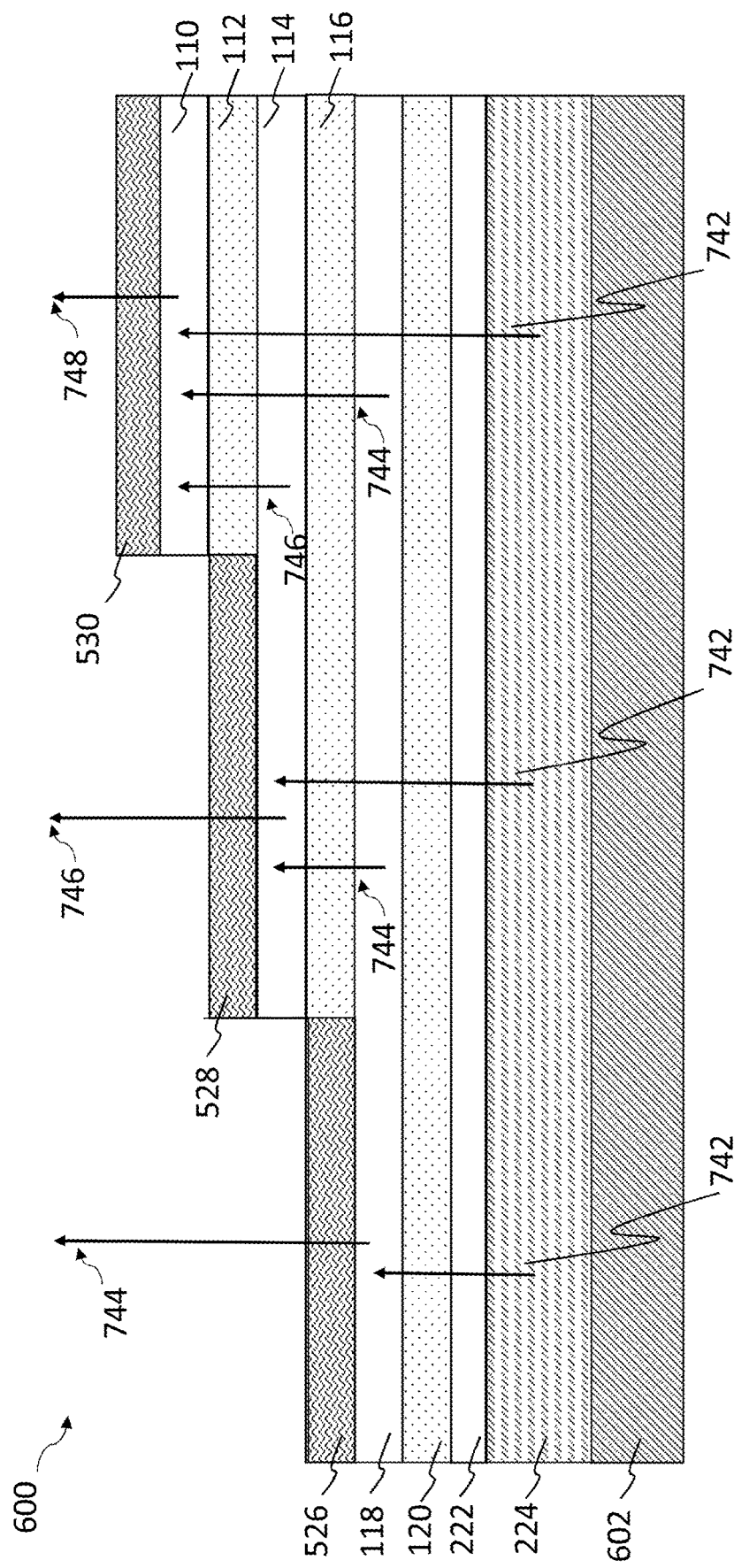
FIG. 6 shows a cross sectional view of a light input and emission from a system of three colour conversion resonator cavities.

In FIG. 6 there is shown a colour conversion resonator system 600 showing the colour conversion resonator system 500 bonded to a CMOS backplane 602 further showing input light of the first primary peak wavelength 742, converted light of the second primary peak wavelength 744, converted light of the third primary peak wavelength 746 and converted light of the fourth primary peak wavelength 748.

The partially reflective region 120 is designed such that light of the first primary peak wavelength 742 is transmitted and light of the second primary peak wavelength 744 is reflected. The partially reflective region 116 is configured such that light of the first primary peak wavelength 742 and light of the second primary peak wavelength 744 is partially transmitted and light of the third primary peak wavelength 746 is reflected. The partially reflective region 112 is configured such that light of the first primary peak wavelength 742, light of the second primary peak wavelength 744 and light of the third primary peak wavelength 746 is partially transmitted and light of the fourth primary peak wavelength 748 is reflected.

Input light of the first primary peak wavelength 742 is emitted from the LED 224 through the colour conversion resonator system 700. In the example of FIG. 6, the first primary peak wavelength 742 corresponds to UV light. Light of the first primary peak wavelength 742 is transmitted through the partially reflective region 120 into the colour conversion resonator cavity 118, where the light is absorbed and down converted by emissive recombination. Light of the first primary peak wavelength 742 is converted in the colour conversion resonator cavity 118 to light of the second primary peak wavelength 744. In the example of FIG. 6, light of the second primary peak wavelength corresponds to blue light.

When an LED, such as the light emitting device 224, is coupled with the colour conversion resonator system 600, the angular distribution of light emission of the input LED 224 is altered. Once the input light from an LED 224 with such a Lambertian distribution of light emission has been absorbed in the MQWs and pump absorbing layers of the colour conversion resonator cavity 118, electron hole pairs are generated in the MQWs and pump absorbing layers. The electrons and holes generated in the pump absorbing layers move to the MQWs. Therefore, the emitted light wavelength is determined by MQW transitions wavelength. This transition wavelength has a spectral range (FWHM: full width half maximum) of ~30 nm for green and ~50 nm for Red when QW materials are AlxInyGa1-x-yN. In general, AlxInyGa1-x-yN or AlxInyGa1-x-yP MQWs emit the light all directions but the colour conversion cavity resonator enhances the emission meeting the cavity condition. The results are narrow beam angle and concentrated emission spectrum of the light of the second primary peak wavelength 744 that is emitted from the colour conversion resonator system 600 of FIG. 6. Similar absorption and transmission occurs in the other colour conversion resonator cavities 114, 110 in accordance with their respective absorption and emission properties.

Light of the second primary peak wavelength 744 resonates in the colour conversion resonator cavity 118 and is transmitted at least in part through the partially reflective region 116. Light of the second primary peak wavelength 744 is also transmitted through the first further partially reflective region 526 and emitted from the associated light emitting surface.

The relative properties of the partially reflective regions 116, 526 on the colour conversion resonator cavity 118 are such that resonant converted light 744 is emitted from a first pixel associated (e.g., pixel with dimension 532 of FIG. 5) with the partially reflective region 526 and such that any converted light with the second primary peak wavelength 744 and light with the first primary peak wavelength pass through the partially reflective region 116 such that the light in parts of the colour conversion resonator system 600 are efficiently reused.

Accordingly, at regions associated with a second and a third pixel (e.g., the regions associated with pixel dimensions 534 and 536 of FIG. 5), light of the second primary peak wavelength 744 is received in the colour conversion resonator cavity 114 through the partially reflective region 116. Light of the first primary peak wavelength 742 that has not been converted is also received in the colour conversion resonator cavity 114.

Light of the first primary peak wavelength 742 and light of the second primary peak wavelength 744 is at least partially converted in the colour conversion resonator cavity 114 to light of the third primary peak wavelength 746. In the example of FIG. 6, the third primary peak wavelength corresponds to green light.

Light of the third primary peak wavelength 746 resonates in the colour conversion resonator cavity 114 and is transmitted through the partially reflective region 112. Light of the third primary peak wavelength 746 is also transmitted through the second further partially reflective region 528 and emitted.

At a second pixel (e.g., the pixel associated with pixel dimension 534 of FIG. 5), light of the third primary peak wavelength 746 is transmitted through the second further partially reflective region 528 and emitted. At a third pixel (e.g., the pixel associated with pixel dimension 536 of FIG. 5), light of the first primary peak wavelength 742, second primary peak wavelength 744 and third primary peak wavelength 746 is received in the colour conversion resonator cavity 110 through the partially reflective region 112. Light of the third primary peak wavelength 746 is converted in the colour conversion resonator cavity 110 to light of the fourth primary peak wavelength 748. Light of the fourth primary peak wavelength 748 corresponds to red light.

Light of the fourth primary peak wavelength 748 resonates in the colour conversion resonator cavity 110 and is transmitted through the partially reflective region 108 and/or the third further partially reflective region 530 to be emitted.

Preferably, input light of the first primary peak wavelength 742 has a wavelength corresponding to ultraviolet (UV) wavelength light. Alternatively, or additionally, input light of the first primary peak wavelength 742 has a wavelength corresponding to blue light. In further examples, different wavelengths of light are used.

Whilst a system showing colour conversion to provide blue, green and red converted light output is demonstrated, in further examples, blue light is used as the first primary peak wavelength. Advantageously, one of the colour conversion resonator cavities and the associated partially reflective layers need not be used where red, green and blue light outputs are desired.

Input light of the first primary peak wavelength 742 has a wavelength corresponding to UV wavelength light. The converted light of the second primary peak wavelength 744 corresponds to blue wavelength light such that the first pixel emits light of the colour blue.

The converted light of the third primary peak wavelength 746 corresponds to green wavelength light such that the second pixel emits light of the colour green. The converted light of the fourth primary peak wavelength 748 corresponds to red wavelength light such that the third pixel emits light of the colour red. Such an embodiment allows for a monolithic integration of red, green and blue pixels to provide a monolithic colour conversion system.

In examples, the first pixel, the second pixel and the third pixel are isolated and individually addressable by the CMOS backplane 602, thereby enabling the formation of a multicolour light emitting display.

Figure 7:
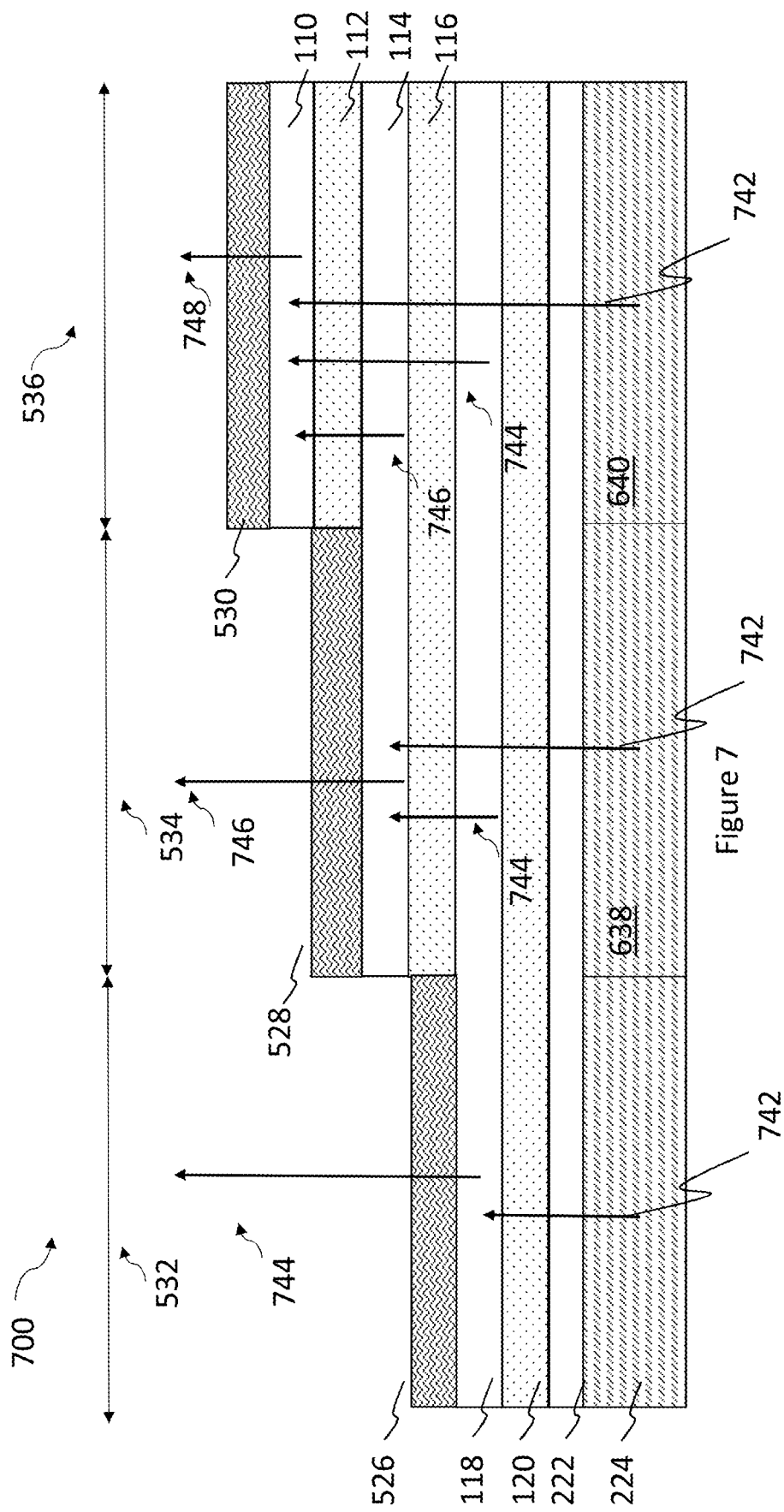
FIG. 7 shows a cross sectional view of a system of three colour conversion resonator cavities with independently addressable light input.

Whilst FIG. 6 illustrates the LED 224, in further examples, individual light emitting diodes are used selectively to provide light to light emitting surfaces associated with particular colour conversion resonator cavities and associated output light. In FIG. 7 there is shown an alternative embodiment of a colour conversion resonator system 700. The colour conversion resonator system 700 comprises the first LED 224, a second LED 638 and a third LED 640. The LEDs 224, 638 and 640 are placed adjacent to one another. Atop the LEDs 224, 638 and 640 are layers 222, 120, 118, 116, 114, 112, 110, 108, 526, 528 and 530 sequentially grown and in the selectively etched configuration of colour conversion resonator system 500.

The first LED 224 is bonded such that input light from the first LED 224 is provided to the first pixel with the pixel dimension 532, the second LED 638 is bonded such that input light from the second LED 638 is provided to the second pixel with the pixel dimension 534, the third LED 640 is bonded such that input light from the third LED 640 is provided to the third pixel with the pixel dimension 536. The LEDs 224, 638, 640 are bonded to the colour conversion resonator cavity system in accordance with the techniques described herein with reference to FIGS. 1 to 6. The LEDs 224, 638, 640 are individually addressable LED devices that can be addressed using a suitable backplane, such as a Si based CMOS backplane.

Beneficially the colour conversion resonator system 700 allows controlled light emission from each of the three pixels individually. The improved angular distribution, intensity and colour purity illustrated herein provides significant benefits, particularly in respect of augmented reality applications that use high resolution arrays of LEDs to form displays in close proximity to users. Further, beneficially, the use of epitaxially grown layers to form colour conversion resonator cavity systems means that the size constraints imparted by quantum-dot based colour conversion systems are overcome and smaller light emitting surfaces of light emitting pixels based on micro LEDs can be provided, and arrays of light emitting pixels with reduced pixel pitch can be provided.

Whilst FIGS. 1-7 illustrate epitaxially grown colour conversion resonator systems that are formed by sequential growth of layers upon a substrate, in further examples, a series of layers is epitaxially grown and subsequently bonded to another series of epitaxial layers. Advantageously, by this method, individual colour conversion resonator cavities, or groups of colour conversion resonator cavities, can be optimised independently and bonded together, thereby to provide high crystalline quality colour conversion resonator cavities that are optimised for their particular wavelength of resonant light.

Figure 8:
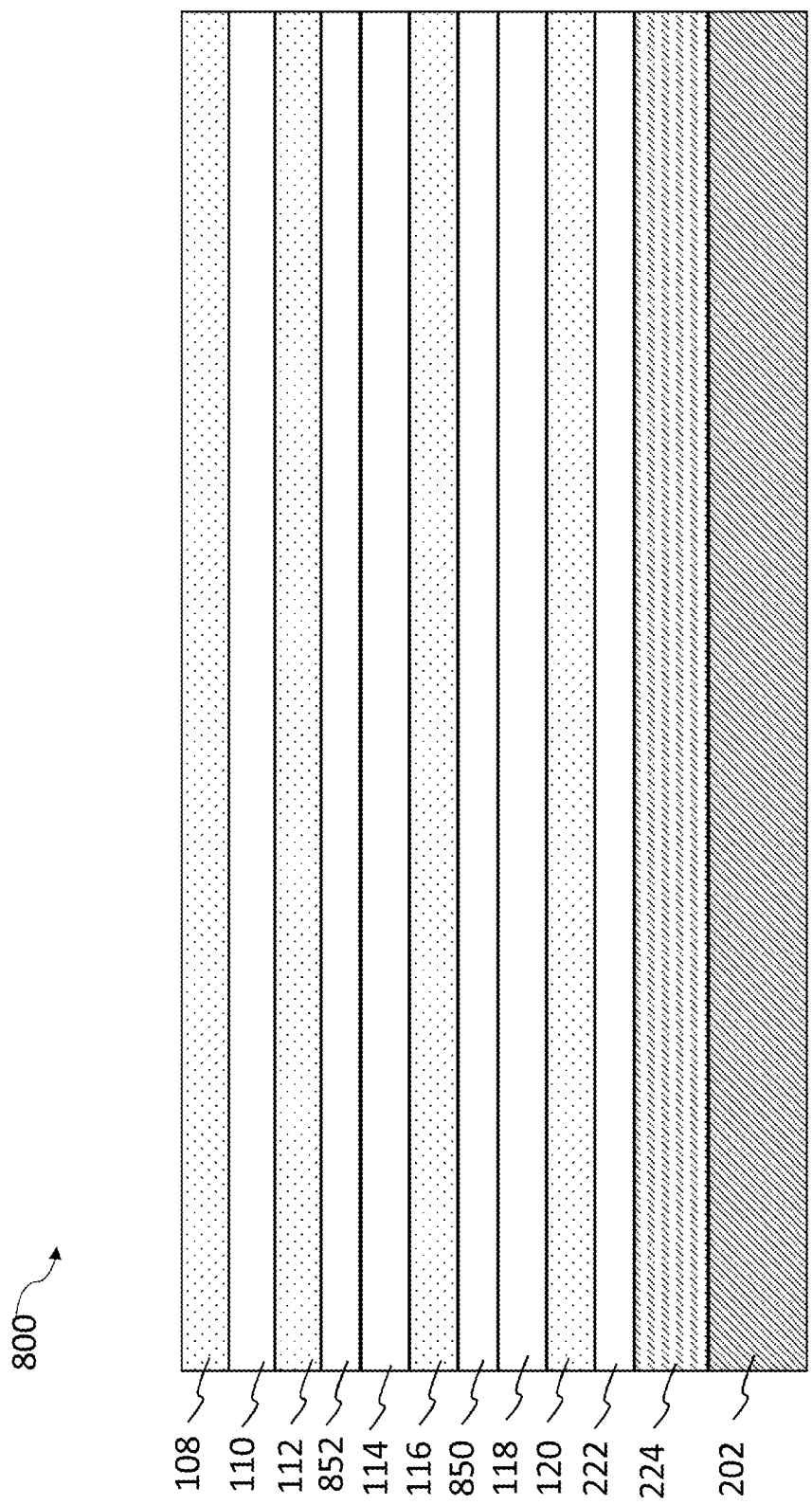
FIG. 8 shows a cross sectional view of a system of three colour conversion resonator cavities.

In FIG. 8 there is shown an alternative embodiment of a colour conversion resonator system 800. The colour conversion resonator system 800 comprises the colour conversion resonator cavity 118 epitaxially grown atop the partially reflective region 120 and subsequently bonded to the input LED 224 and the substrate device 202 via the bonding layer 222. Atop this series of layers there is bonded the partially reflective region 116 and the colour conversion resonator cavity 114 via the bonding layer 850. Additionally, atop this series of layers there is bonded the partially reflective region 112, the colour conversion resonator cavity 110 and, optionally, the partially reflective region 108 via the bonding layer 852. Effectively, each colour conversion resonator cavity 110, 114, 118 and its respective partially reflective regions are provided separately and bonded together to form the structure of FIG. 8. Advantageously, each colour conversion resonator cavity 110, 114, 118 and its respective partially reflective regions can be optimised separately prior to being bonded together to form the eventual structure. Such individual optimisation means, for example, that blue and green light emitting structures may be formed based on nitrides materials, whereas red light emitting structures may be formed using different materials, such as phosphide materials. In further examples, different combinations of materials are used in order to provide optimised structures for colour conversion and resonance at particular frequencies of light.

The LED 224 is bonded to the partially reflective region 120 using dielectric bonding. The surface of the LED 224 that is to be bonded to the partially reflective region 120 is terminated with a high density oxide film in order to facilitate such bonding. The surface of the partially reflective region 120 that is to be bonded to the input LED 224 is also terminated with a high density oxide film in order to facilitate wafer level oxide bonding. Accordingly, the primary light emitting surface of the LED 224 is placed in close proximity or contact with the partially reflective region 120 such that light that is output from the LED 224 acts as input light for the colour conversion resonator system 800. Similarly, the colour conversion resonator cavity 118 and the partially reflective region 116 are terminated with a high density oxide film to facilitate wafer level oxide bonding. Additionally, the colour conversion resonator cavity 114 and the partially reflective region 112 are terminated with a high density oxide film to facilitate wafer level oxide bonding.

In further examples, the LED 224 is bonded to the partially reflective region 120 using polymer bonding, such as polyimide bonding. Similarly, the colour conversion resonator cavity 118 is bonded to the partially reflective region 116 using polymer bonding, such as polyimide bonding. Further, the colour conversion resonator cavity 114 is bonded to the partially reflective region 112 using polymer bonding, such as polyimide bonding. In further examples, additional or alternative bonding mechanisms are used in order to attach the corresponding layers. Advantageously, the layers are bonded to form a single device with minimal interface loss of light emission from the LED 224 at the interface with the colour conversion resonator system 800.

Whilst the layers are shown to be bonded in FIG. 8 with bonding layers 222, 850, 852, in further example additional and/or alternative bonding layers are used to form the structure 800 of FIG. 8.

Figure 9:
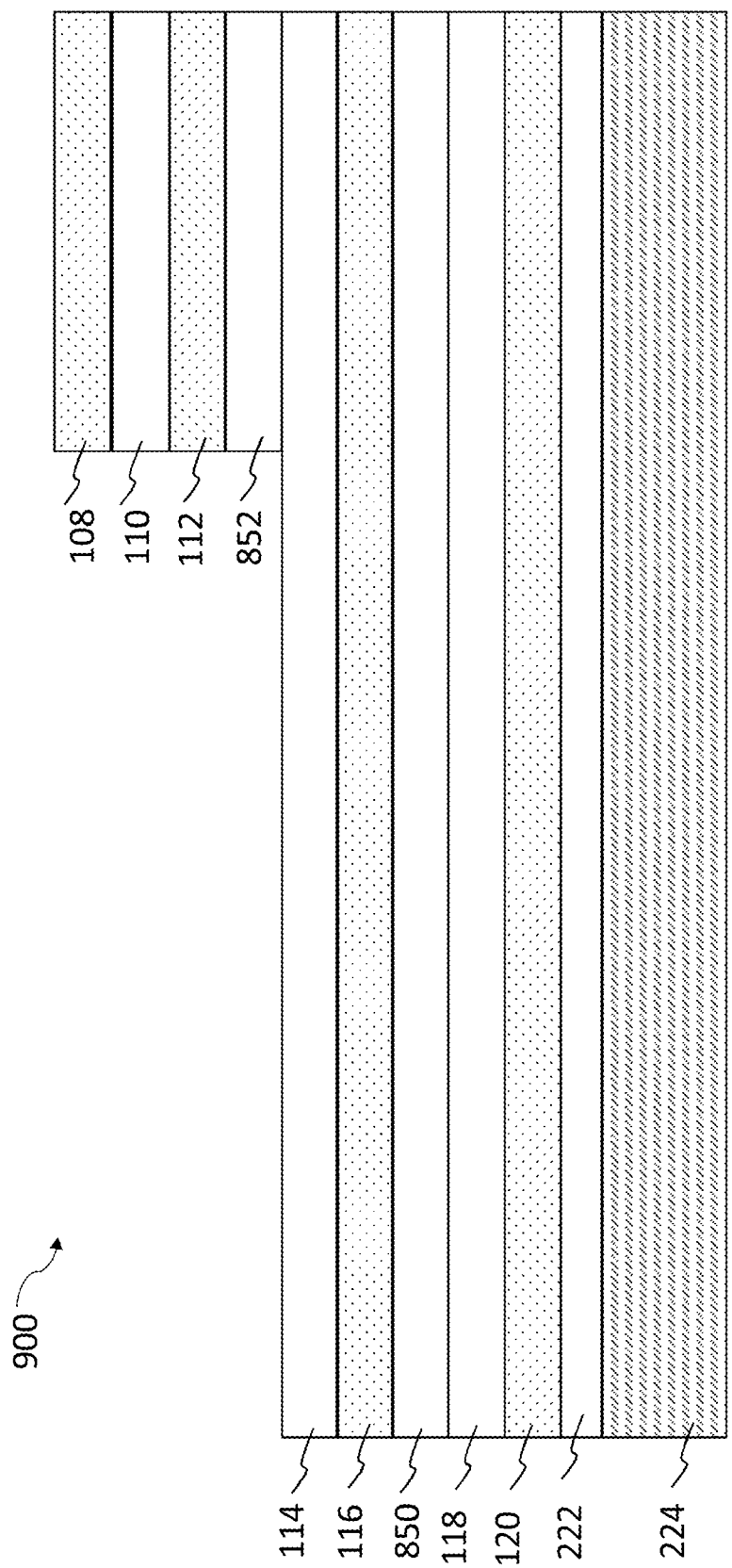
FIG. 9 shows a cross sectional view of the system of three colour conversion resonator cavities of FIG. 8 that has been processed further.

In FIG. 9 there is shown a colour conversion resonator system 900 comprising the LED 224, the bonding layer 222, the partially reflective region 120, the colour conversion resonator cavity 118, the bonding layer 850, the further partially reflective region 116 and the further colour conversion resonator cavity 114. Each of these layers is grown sequentially and subsequently bonded as described above in FIG. 8. Atop this series of layers partially etched layers from the structure described with respect to FIG. 8 is shown. The etched layers are the bonding layer 852, the partially reflective region 112, the colour conversion resonator cavity 110 and the partially reflective region 108. These layers have been etched such that said layers 108, 110 and 112 and 852 form a partially overlapping region with remaining layers 224, 222, 120, 118, 850, 116 and 114.

In further examples, the colour conversion resonator system 900 is provided by bonding layers that have already been etched in order to provide the partially overlapping region. For example, arrays of etched layers are provided and bonded together to provide partially overlapping regions corresponding to different light output wavelengths.

Figure 10:
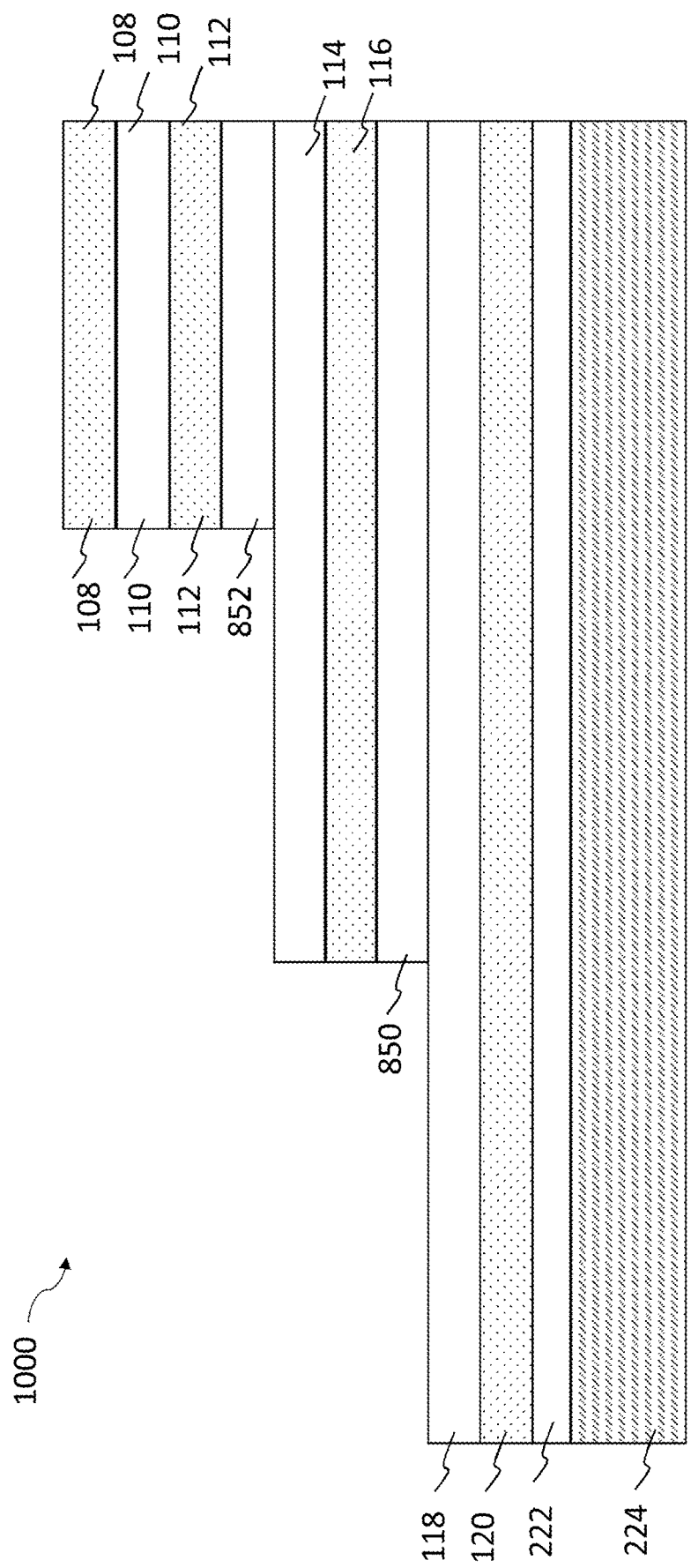
FIG. 10 shows a cross sectional view of the system of three colour conversion resonator cavities of FIG. 9 that has been processed further.

In FIG. 10 there is shown a colour conversion resonator system 1000 comprising the LED 224, the bonding layer 222, the partially reflective region 120 and the colour conversion resonator cavity 118. These layers, grown and bonded sequentially, as described above, remain unetched. Atop said layers 224, 222, 120 and 118, is the bonding layer 850, the partially reflective region 116 and the further colour conversion resonator cavity 114. The bonding layer 850, the partially reflective region 116 and the colour conversion resonator cavity 114 have selectively been etched such that layers 114, 116 and 850 form a partially overlapping region with remaining layers 224, 222, 120 and 118. As described above, atop layers 114, 116 and 850 is the bonding layer 852 the further partially reflective region 112, the further colour conversion resonator cavity 110 and the further partially reflective region 108 such that said layers 852, 112, 110 and 108 form a partially overlapping region with layers 114, 116 and 850. The use of an etch stop (not shown) between the colour conversion resonator cavity 118 and the bonding layer 850 facilitates control of the removal of material by etching. The second etch process forms an exposed light emitting surface region associated with the colour conversion resonator cavity 114 and an exposed light emitting surface region associated with the colour conversion resonator cavity 118. In further examples, the colour conversion resonator system 1000 is provided by bonding layers that have already been etched in order to provide the partially overlapping region. For example, arrays of etched layers are provided and bonded together to provide partially overlapping regions corresponding to different light output wavelengths.

Figure 11:
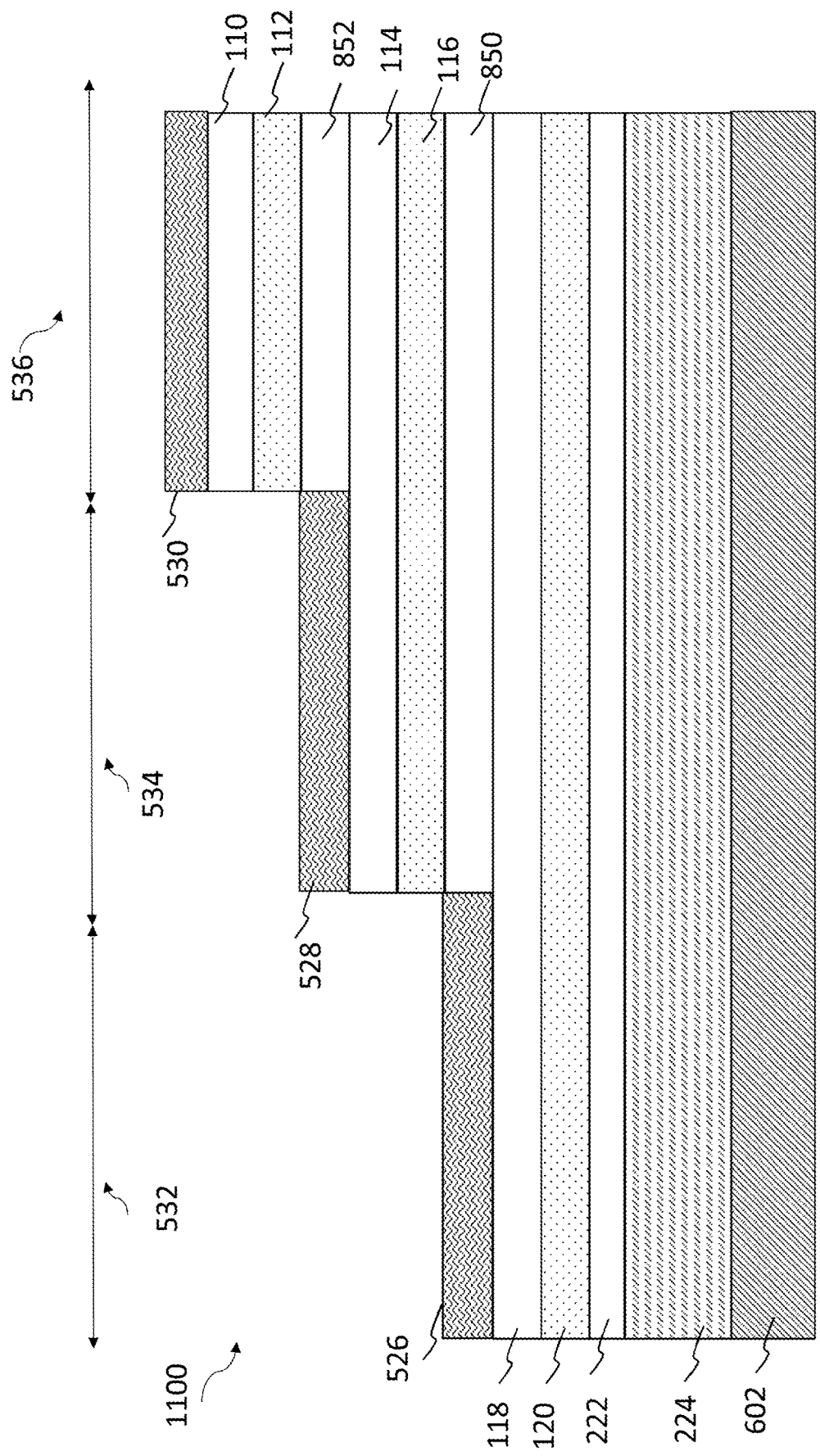
FIG. 11 shows a cross sectional view of the system of three colour conversion resonator cavities of FIG. 10 that has been processed further.

In FIG. 11 there is shown a colour conversion resonator system 1100 where the colour conversion resonator system 1000 described with reference to FIG. 10 has been further processed to provide a first further partially reflective region 526, a second further partially reflective region 528, and a third further partially reflective region 530. The third further partially reflective region 530 associated with the colour conversion resonator cavity 110 is provided instead of the partially reflective region 108 formed in the initial epitaxial structure. Alternatively, the partially reflective region 108 remains in place and the third further partially reflective region 530 is not formed in the structure shown at FIG. 11. The first further partially reflective region 526 is formed atop the exposed surface of the colour conversion resonator cavity 118. The second further partially reflective region 528 is formed atop the exposed surface of the colour conversion resonator cavity 114.

Whilst the LED 224 is shown as a single LED, in further examples the LED 224 is formed from individually addressable LED devices with individual LED devices corresponding to light output at one or more pixels formed from the partially overlapping regions of the colour conversion resonator system 1100. In such a way, high resolution displays can be formed.

In a further example, different combinations of cavities are grown together and subsequently bonded together. For example, the colour conversion resonator cavity 118 and the colour conversion resonator cavity 114 can be grown in one step with the partially reflective regions 120 and 116. These epitaxially grown layers can then be bonded to the colour conversion resonator cavity 110 and partially reflective regions 112 and 108 via a bonding layer. Beneficially, such a process allows the colour conversion resonator cavities 118 and 114 to be grown from similar materials to provide high quality cavities and allows colour conversion resonator cavity 110 to be grown from a different material which is more optimal for the required wavelength of light in the colour conversion resonator cavity 110. For example, the colour conversion resonator cavity 118 can correspond to blue wavelength light and the colour conversion resonator cavity 114 can correspond to green wavelength light. As such, it may be optimal to grow colour conversion resonator cavities 118 and 114 together from nitride based materials. The colour conversion resonator cavity 110 can correspond to red wavelength light. As such, it may be optimal to grow the colour conversion resonator cavity 110 separately from phosphide based materials.

In order to facilitate the bonding processes described with reference to FIGS. 8 to 11, handling wafers or growth substrates for the individual components are used and removed at appropriate stages in the device processing.

Accordingly, the colour conversion resonator system 1100 can be used to provide an array of pixels, such as a high resolution micro LED array of pixels that emit light of different wavelengths in a manner similar to that described with the colour conversion resonator systems of FIGS. 1 to 7.

Whilst methods for forming a colour conversion resonator system are described above with reference to FIGS. 1 to 11, the skilled person understands that in further examples, additional or alternative steps are used and in yet further examples, some steps are omitted. In further examples, the order of processing steps is altered whilst providing one or more LED structures in combination with one or more colour conversion resonator cavities to provide improved light emission properties at least as described herein.

The invention claimed is:

1. A color conversion resonator system, comprising:
a first partially reflective region configured to transmit light of a first primary peak wavelength and to reflect light of a second primary peak wavelength;
a second partially reflective region configured to at least partially transmit light of the first and second primary peak wavelengths and to reflect light of a third primary peak wavelength;
a third partially reflective region configured to at least partially reflect light with the third primary peak wavelength;
a first color conversion resonator cavity arranged to receive input light with the first primary peak wavelength through the first partially reflective region and to convert at least some of the light of the first primary peak wavelength to provide light of the second primary peak wavelength, wherein the first color conversion resonator cavity is arranged such that the second primary peak wavelength resonates in the first color conversion resonator cavity and resonant light with the second primary peak wavelength is output through the second partially reflective region; and
a second color conversion resonator cavity arranged to receive input light comprising the second primary peak wavelength through the second partially reflective region and to convert at least some of the second primary peak wavelength to provide light of the third primary peak wavelength, wherein the second color conversion resonator cavity is arranged such that the third primary peak wavelength resonates in the second color conversion resonator cavity and resonant light with the third primary peak wavelength is output through the third partially reflective region, wherein the first color conversion resonator cavity and the second resonator cavity are arranged partially to overlap to provide a non-overlapping portion and an overlapping portion thereby to define a first light emitting surface and a second light emitting surface respectively, wherein the first light emitting surface is arranged to provide resonant light of the second primary peak wavelength and the second light emitting surface is arranged to provide resonant light of the third primary peak wavelength.

2. The color conversion resonator system according to claim 1, wherein the color conversion resonator system is a monolithic color conversion system.

3. The color conversion resonator system according to claim 1, wherein the first partially reflective region and the second partially reflective region are separated by a distance of (N+1) multiplied by $\lambda_{converted}/2n(\lambda_{converted})$, wherein N is an positive integer number, $\lambda_{converted}$ is the second primary peak wavelength and $n(\lambda_{converted})$ is the effective refractive index of the material separating the first partially reflective region and the second partially reflective region, thereby to define the length of the first color conversion resonator cavity and/or wherein the second partially reflective region and the third partially reflective region are separated by a distance of (N+1) multiplied by $\lambda_{converted}/2n(\lambda_{converted})$, wherein N is an positive integer number, $\lambda_{converted}$ is the third primary peak wavelength and $n(\lambda_{converted})$ is the effective refractive index of the material separating the second partially reflective region and the third partially reflective region, thereby to define the length of the second color conversion resonator cavity.

4. The color conversion resonator system according to claim 1, wherein the color conversion resonator system comprises a first LED arranged to control light emission from the first light emitting surface and a second LED arranged to control light emission from the second light emitting surface.

5. The color conversion resonator system according to claim 1, wherein the third partially reflective region is further configured to reflect light with a fourth primary peak wavelength, the color conversion resonator further comprising:
a fourth partially reflective region configure to at least partially reflect light with the fourth primary peak wavelength; and
a third color conversion resonator cavity arranged to receive input light comprising the third primary peak wavelength through the third partially reflective region and to convert at least some of the third primary peak wavelength to provide light of the fourth primary peak wavelength, wherein the third color conversion resonator cavity is arranged such that the fourth primary peak wavelength resonates in the third color conversion resonator cavity and resonant light with the fourth primary peak wavelength is output through the fourth partially reflective region, wherein the third partially reflective region and the fourth partially reflective region are separated by a distance of (N+1) multiplied by $\lambda_{converted}/2n(\lambda_{converted})$, wherein N is an positive integer number, $\lambda_{converted}$ is the fourth primary peak wavelength and $n(\lambda_{converted})$ is the effective refractive index of the material separating the third partially reflective region and the fourth partially reflective region, thereby to define the length of the third color conversion resonator cavity.

6. The color conversion resonator system according to claim 5, wherein the second color conversion resonator cavity and the third color conversion resonator cavity are arranged partially to overlap to provide a non-overlapping portion and an overlapping portion thereby to define the second light emitting surface and a third light emitting surface respectively, wherein the second light emitting surface is arranged to provide resonant light of the third primary peak wavelength and the third light emitting surface is arranged to provide resonant light of the fourth primary peak wavelength.

7. The color conversion resonator system according to claim 1, wherein at least one of the color conversion resonator cavities comprises at least one quantum well layer, wherein the at least one quantum well layer is placed to coincide with an antinode of the color conversion resonator cavity standing wavelength for converted light, thereby enhancing at least one of the intensity, spectral width and directionality of output light with the resonant converted wavelength of light.

8. The color conversion resonator system according to claim 7, wherein at least one of the color conversion resonator cavities comprises at least one absorption layer configured to absorb input light thereby to enable transfer of energy from the input light wavelength into the at least one quantum well layer, wherein the absorption layer comprises a material with a lower energy bandgap than the energy of the input light.

9. The color conversion resonator system according to claim 1, comprising at least one diffusion barrier arranged to reduce diffusion of carriers from at least one of the color conversion resonator cavities.

10. The color conversion resonator system according to claim 1, wherein at least one of the color conversion resonator cavities comprises a quantum well layer, the quantum well layer comprising one or more quantum wells, and a further quantum well layer comprising one or more quantum wells, wherein the separation of the quantum well layer and the further quantum well layer is N multiplied by $\lambda_{converted}/2n(\lambda_{converted})$, wherein N is an positive integer number, $\lambda_{converted}$ is the wavelength of the resonant light in the color conversion resonator cavity and $n(\lambda_{converted})$ is the effective refractive index of the material between the quantum well layer and the further quantum well layer at the wavelength of the resonant light in the color conversion resonator cavity.

11. The color conversion resonator system according to claim 1, comprising at least one further partially reflective region corresponding to at least one of the first and second light emitting surfaces.

12. The color conversion resonator system according to claim 1, wherein at least one of the partially reflective regions and/or the further partially reflective regions comprise a distributed Bragg reflector, wherein the distributed Bragg reflector is at least one of: a double band distributed Bragg reflector, a conventional distributed Bragg reflector and a vertical stack of two distributed Bragg reflectors.

13. The color conversion resonator system according to claim 12, wherein at least one of the partially reflective regions comprises a blue wavelength centred low Herpin index DBR or a green wavelength centred low Herpin index DBR or a red wavelength centred low Herpin index DBR.

14. The color conversion resonator system according to claim 1, wherein at least one of the partially reflective regions and the color conversion resonator cavities comprises an epitaxial crystalline layer, wherein the color conversion resonator system comprises at least one of a dielectric material and a III-V semiconductor material.

15. An array of pixels comprising the color conversion resonator system of claim 1.

16. The array according to claim 15, wherein the array comprise a first pixel configured to emit light of a different wavelength to a second pixel, wherein the first and/or second pixel comprises a further partially reflective region corresponding to its light emitting surface.

17. The array of pixels according to claim 16, further comprising a third pixel configured to emit light of a different wavelength to the first pixel and the second pixel.

18. A method of forming the color conversion resonator system according to claim 1.

19. The method according to claim 18 comprising forming at least one of the color conversion resonator cavities on a substrate.

20. The method according to claim 19, comprising at least one of: forming at least one of the color conversion resonator cavities on the substrate comprises epitaxial growth of a plurality of layers; and forming at least one of the partially reflective regions on the substrate, forming at least one of the partially reflective regions on the substrate comprises sequentially forming at least one of the color conversion resonator cavities and partially reflective regions on the substrate; and bonding the color conversion resonator system to at least one LED; and bonding together two or more of the first partially reflective region; the second partially reflective region, the third partially reflective region, the first color conversion resonator cavity and the second color conversion resonator cavity; and selectively etching the color conversion resonator system, thereby to provide the light emitting surfaces.

\* \* \* \* \*